US012615937B2

(12) United States Patent
Zhou et al.

(10) Patent No.: US 12,615,937 B2
(45) Date of Patent: Apr. 28, 2026

(54) DISPLAY SUBSTRATE COMPRISING CIRCUIT AND DAM ISOLATION REGIONS, MANUFACTURING METHOD THEREOF, AND DISPLAY APPARATUS INCLUDING THE DISPLAY SUBSTRATE

(71) Applicants: Chengdu BOE Optoelectronics Technology Co., Ltd., Chengdu (CN); BOE Technology Group Co., Ltd., Beijing (CN)

(72) Inventors: Hongjun Zhou, Beijing (CN); Long Ma, Beijing (CN); Tianyi Cheng, Beijing (CN); Yao Huang, Beijing (CN); Binyan Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/016,456

(22) PCT Filed: Jan. 21, 2022

(86) PCT No.: PCT/CN2022/073243
§ 371 (c)(1),
(2) Date: Jan. 17, 2023

(87) PCT Pub. No.: WO2023/137709
PCT Pub. Date: Jul. 27, 2023

(65) Prior Publication Data
US 2025/0268045 A1      Aug. 21, 2025

(51) Int. Cl.
H10K 59/131 (2023.01)
H10K 59/12 (2023.01)
(Continued)

(52) U.S. Cl.
CPC ..... H10K 59/1315 (2023.02); H10K 59/1201 (2023.02); H10K 59/1213 (2023.02);
(Continued)

(58) Field of Classification Search
CPC ........... H10K 59/1315; H10K 59/1201; H10K 59/122; H10K 59/1213; H10K 59/873; H10K 2102/3026
(Continued)

(56) References Cited

U.S. PATENT DOCUMENTS 7,928,654 B2 *    4/2011   Tsuchiya .............. H10K 59/131
                                                             313/506
9,412,802 B2 *    8/2016   Hyun ................... H10K 59/131
(Continued)

FOREIGN PATENT DOCUMENTS

CN          105244365 A          1/2016
CN          108520889 A          9/2018
(Continued)

*Primary Examiner* — Eric W Jones
(74) *Attorney, Agent, or Firm* — Ling Wu; Stephen Yang; Ling and Yang Intellectual Property

(57)          ABSTRACT

A display substrate, a preparation method thereof, and a display apparatus are provided, wherein the display substrate includes a display area and an edge area, and the display substrate further comprises a substrate and a power supply line arranged on the substrate and located in the edge area, the power supply line includes a first power supply portion and a second power supply portion connected with each other, the second power supply portion being located on a side of the first power supply portion far away from the substrate; the display area including a plurality of display units, at least one display unit includes a pixel driving circuit and a light emitting device, the pixel driving circuit being electrically connected with an anode of the light emitting
(Continued)

device, the power supply line being electrically connected with a cathode of the light emitting device.

19 Claims, 11 Drawing Sheets

(51) Int. Cl.

| | |
|---|---|
| *H10K 59/121* | (2023.01) |
| *H10K 59/122* | (2023.01) |
| *H10K 59/80* | (2023.01) |
| *H10K 102/00* | (2023.01) |

(52) U.S. Cl.
CPC ......... *H10K 59/122* (2023.02); *H10K 59/873* (2023.02); *H10K 2102/3026* (2023.02)

(58) Field of Classification Search
USPC .............................................. 257/40, 59, 99
See application file for complete search history.

(56) References Cited

U.S. PATENT DOCUMENTS

| | | | | |
|---|---|---|---|---|
| 9,767,727 | B2 * | 9/2017 | Byun ..................... | G09G 3/006 |
| 10,170,534 | B1 * | 1/2019 | Kim ....................... | H10D 86/60 |
| 10,607,943 | B2 * | 3/2020 | Kim ..................... | H10K 59/131 |
| 10,879,319 | B2 * | 12/2020 | Bang .................... | H10K 59/126 |
| 11,004,915 | B2 * | 5/2021 | Byun ................... | H10K 59/124 |
| 11,569,477 | B2 * | 1/2023 | Song ................. | H10K 59/8791 |
| 11,594,590 | B2 * | 2/2023 | Bang ..................... | H10H 29/10 |
| 11,616,115 | B2 * | 3/2023 | You .................... | H10K 59/1315 |
| | | | | 257/40 |
| 11,980,063 | B2 * | 5/2024 | Kim ..................... | G09G 3/3275 |
| 12,089,463 | B2 * | 9/2024 | Okabe ................. | H10K 59/124 |
| 12,268,061 | B2 * | 4/2025 | Jeon .................. | H10K 59/8722 |
| 2005/0046346 | A1 * | 3/2005 | Tsuchiya ........... | H10K 59/8722 |
| | | | | 313/503 |
| 2005/0218396 | A1 * | 10/2005 | Tsuchiya ............. | H10K 59/122 |
| | | | | 257/E27.111 |
| 2007/0229412 | A1 * | 10/2007 | Kawasaki ............. | G09G 3/006 |
| | | | | 345/76 |
| 2013/0207117 | A1 * | 8/2013 | An ...................... | H10K 59/131 |
| | | | | 257/40 |
| 2015/0090966 | A1 * | 4/2015 | Hyun ................... | H10K 59/131 |
| | | | | 438/151 |
| 2015/0228927 | A1 * | 8/2015 | Kim ..................... | H10K 59/805 |
| | | | | 257/40 |
| 2017/0141164 | A1 | 5/2017 | Xiong et al. | |
| 2018/0122881 | A1 * | 5/2018 | Shin ..................... | H10K 59/122 |
| 2018/0150111 | A1 * | 5/2018 | Kim ..................... | H10K 59/121 |
| 2018/0151838 | A1 * | 5/2018 | Park ...................... | G06F 3/0412 |
| 2018/0166525 | A1 * | 6/2018 | Kim ....................... | H10K 71/70 |
| 2018/0284927 | A1 | 10/2018 | Kim et al. | |
| 2018/0350891 | A1 * | 12/2018 | Kim ..................... | H10D 86/481 |
| 2019/0006442 | A1 * | 1/2019 | Byun ................. | H10K 59/131 |
| 2019/0131321 | A1 | 5/2019 | Yuan | |
| 2019/0148469 | A1 * | 5/2019 | Lhee ................... | H10K 59/131 |
| | | | | 257/40 |
| 2019/0172790 | A1 * | 6/2019 | Kim ...................... | G06F 3/0412 |
| 2019/0378886 | A1 * | 12/2019 | Jeong ................. | H10K 10/482 |
| 2020/0089277 | A1 | 3/2020 | Park et al. | |
| 2020/0161576 | A1 * | 5/2020 | Hsu ..................... | H10K 59/122 |
| 2020/0185647 | A1 * | 6/2020 | Lee .................... | H10K 59/8722 |
| 2020/0212156 | A1 | 7/2020 | Gu et al. | |
| 2021/0119178 | A1 * | 4/2021 | Song ................. | H10K 59/8791 |
| 2021/0202664 | A1 * | 7/2021 | Kim ................... | H10K 59/131 |
| 2021/0376037 | A1 * | 12/2021 | You ................... | H10K 59/8052 |
| 2021/0408082 | A1 | 12/2021 | Xiao et al. | |
| 2022/0310772 | A1 | 9/2022 | Qing et al. | |
| 2024/0274083 | A1 * | 8/2024 | Jang ................... | G09G 3/3258 |
| 2025/0004036 | A1 * | 1/2025 | Mitani ................. | H10K 71/70 |

FOREIGN PATENT DOCUMENTS

| | | | | |
|---|---|---|---|---|
| CN | 109326633 | A | 2/2019 | |
| CN | 109713012 | A | 5/2019 | |
| CN | 110098228 | A | 8/2019 | |
| CN | 110581142 | A | 12/2019 | |
| CN | 110911452 | A | 3/2020 | |
| CN | 213042915 | U | 4/2021 | |
| CN | 113097263 | A | 7/2021 | |
| CN | 113224084 | A | 8/2021 | |
| CN | 113725380 | A | 11/2021 | |
| CN | 113823671 | A | 12/2021 | |
| JP | 2007164161 | A | 6/2007 | |
| KR | 1020180112892 | A | 10/2018 | |
| WO | WO-2019014825 | A1 * | 1/2019 | ............. G09G 3/20 |

* cited by examiner

DISPLAY SUBSTRATE COMPRISING CIRCUIT AND DAM ISOLATION REGIONS, MANUFACTURING METHOD THEREOF, AND DISPLAY APPARATUS INCLUDING THE DISPLAY SUBSTRATE

CROSS-REFERENCE TO RELATED APPLICATION

The present application is a U.S. National Phase Entry of International Application No. PCT/CN2022/073243 having an international filing date of Jan. 21, 2022. The above-identified application is hereby incorporated by reference.

TECHNICAL FIELD

The present disclosure relates to, but is not limited to, the field of display technologies, and in particular to a display substrate, a preparation method thereof, and a display apparatus.

BACKGROUND

An Organic Light Emitting Diode (OLED for short) is an active light emitting display device, which has advantages of auto-luminescence, a wide viewing angle, a high contrast ratio, low power consumption, an extremely high response speed, lightness and thinness, bendability, and a low cost, etc. With constant development of display technologies, a flexible display apparatus (Flexible Display) using an OLED as a light emitting device and performing signal control using a Thin Film Transistor (TFT for short) has become a mainstream product in the field of display at present.

SUMMARY

The following is a summary of subject matters described herein in detail. The summary is not intended to limit the protection scope of claims.

In a first aspect, the invention provides a display substrate, which includes a display area and an edge area located on a side of the display area, and the display substrate further includes a substrate and a power supply line arranged on the substrate and located in the edge area, wherein the power supply line includes a first power supply portion and a second power supply portion connected with each other, and the second power supply portion is located on a side of the first power supply portion away from the substrate;

The display area includes a plurality of display units, wherein at least one display unit includes a pixel driving circuit and a light emitting device, wherein the pixel driving circuit is electrically connected with an anode of the light emitting device, and the power supply line is electrically connected with a cathode of the light emitting device, an orthographic projection of the second power supply portion on the substrate is at least partially overlapped with an orthographic projection of the first power supply portion on the substrate, and a distance between an end of the second power supply portion away from the display area and the display area is greater than or equal to a distance between an end of the first power supply portion away from the display area and the display area.

In some possible implementations, the edge area includes a circuit region and an isolation dam region sequentially arranged in a direction away from the display area, wherein the circuit region includes: a first circuit region, a second circuit region, and a third circuit region sequentially arranged in a direction away from the display area;

the pixel driving circuit includes a writing transistor, a compensation transistor, a light emitting transistor, a first scan signal line, a second scan signal line and a light emitting signal line; wherein the first scan signal line is electrically connected to a control electrode of the writing transistor, the second scan signal line is electrically connected to a control electrode of the compensation transistor, and the light emitting signal line is electrically connected to a control electrode of the light emitting transistor; and the writing transistor and the compensation transistor have different transistor types;

the display substrate further includes a first driving circuit located in the first circuit region, a second driving circuit located in the second circuit region, and a third driving circuit located in the third circuit region and the isolation dam region;

the first driving circuit is electrically connected with the first scan signal line, the second driving circuit is electrically connected with the second scan signal line, and the third driving circuit is electrically connected with the light emitting signal line;

the first power supply portion is located in the isolation dam region, and the second power supply portion is located in the isolation dam region and the circuit region; and an orthographic projection of the second power supply portion on the substrate is at least partially overlapped with an orthographic projection of the third driving circuit on the substrate, and has no overlapping area with an orthographic projection of the second driving circuit on the substrate.

In some possible implementations, the display substrate further includes: a crack detection line located in the isolation dam region, wherein the crack detection line is arranged in the same layer as the first power supply portion and located on a side of the first power supply portion away from the display area; and a distance between the first power supply portion and the crack detection line is greater than or equal to 1 micron and less than or equal to 6 microns.

In some possible implementations, a distance between the first power supply portion and the third driving circuit is greater than or equal to 1 micron and less than or equal to 6 microns.

In some possible implementations, the display substrate further includes a first planarization layer located in the display area, the circuit region and the isolation dam region and a first protective layer located in the isolation dam region; the first planarization layer is arranged between the first power supply portion and the second power supply portion and is arranged in the same layer as the first protective layer; and an orthographic projection of the first protective layer on the substrate covers an orthographic projection of the crack detection line on the substrate and at least partially overlaps with an orthographic projection of the first power supply portion on the substrate.

In some possible implementations, the third driving circuit includes a clock signal line located in the isolation dam region; wherein the clock signal line is arranged in the same layer as the first power supply portion and is located on a side of the first power supply portion close to the display area; and an orthographic projection of the first planarization layer on the substrate covers an orthographic projection of the clock signal line on the substrate, and has no overlapping area with an orthographic projection of the first power supply portion on the substrate.

In some possible implementations, the second power supply portion is provided with a plurality of second vias exposing the first planarization layer, and the plurality of second vias are arranged in a matrix; and an orthographic projection of the plurality of second vias on the substrate overlaps at least partially with an orthographic projection of the third driving circuit on the substrate.

In some possible implementations, the display substrate further includes a second planarization layer located in the display area and the circuit region and a second protective layer located in the isolation dam region; the second planarization layer is located on a side of the second power supply portion away from the substrate and is arranged in the same layer as the second protective layer; an orthographic projection of the second protective layer on the substrate covers an orthographic projection of the first protective layer on the substrate, and an orthographic projection of the second planarization layer on the substrate covers an orthographic projection of the second vias on the substrate.

In some possible implementations, the display substrate further includes an auxiliary power supply line located in the edge area; the anode is located on a side of the second planarization layer away from the substrate and is arranged in the same layer as the auxiliary power supply line; the auxiliary power supply line is electrically connected with the second power supply portion; and an orthographic projection of the auxiliary power supply line on the substrate overlaps at least partially with orthographic projections of the first driving circuit, the second driving circuit, and the third driving circuit on the substrate.

In some possible implementations, the auxiliary power supply line is provided with a plurality of fifth vias exposing the second planarization layer, and the plurality of fifth vias are arranged in a matrix; the plurality of fifth vias are located in the first circuit region, the second circuit region and the third circuit region; and an orthographic projection of the fifth vias located in the third circuit region on the substrate at least partially overlaps an orthographic projection of second vias on the substrate.

In some possible implementations, the display substrate further includes a pixel definition layer located in the display area and an isolation layer located in the circuit region; the pixel definition layer is located on a side of the anode away from the substrate and is arranged in the same layer as the isolation layer; and a distance between an end of the isolation layer away from the display area and the display area is less than or equal to a distance between an end of the second planarization layer away from the display area and the display area, and an orthographic projection of the isolation layer on the substrate covers an orthographic projection of fifth vias on the substrate.

In some possible implementations, the display substrate further includes: an organic light emitting layer sequentially stacked on the substrate and located in the display area and a cathode located in the display area and the circuit region; and the cathode is electrically connected with the auxiliary power supply line.

In some possible implementations, the isolation dam region further includes a first isolation dam and a second isolation dam; the second isolation dam is located on a side of the first isolation dam away from the display area and located on a side of the second protective layer close to the display area.

In some possible implementations, the display substrate further includes a first dam foundation, a third dam foundation, a fifth dam foundation, and a seventh dam foundation which are located in the isolation dam region; the first dam foundation is arranged in the same layer as the first planarization layer, the third dam foundation is arranged in the same layer as the second planarization layer, the fifth dam foundation is arranged in the same layer as the pixel definition layer, and the seventh dam foundation is located on a side of the pixel definition layer away from the substrate; the second power supply portion covers the first dam foundation, the third dam foundation is arranged on the second power supply portion covering the first dam foundation and an orthographic projection of the third dam foundation on the substrate covers an orthographic projection of the first dam foundation on the substrate, the fifth dam foundation is arranged on the third dam foundation and an orthographic projection of the fifth dam foundation on the substrate covers the orthographic projection of the third dam foundation on the substrate, and the seventh dam foundation is arranged on the fifth dam foundation and the orthographic projection of the fifth dam foundation on the substrate covers an orthographic projection of the seventh dam foundation on the substrate; the auxiliary power supply line partially covers the third dam foundation; and the first dam foundation, the second power supply portion covering the first dam foundation, the third dam foundation, the fifth dam foundation, and the seventh dam foundation form a second isolation dam.

In some possible implementations, the display substrate further includes a second dam foundation, a fourth dam foundation and a sixth dam foundation located in the isolation dam region; the second dam foundation is arranged in the same layer as the second planarization layer, the fourth dam foundation is arranged in the same layer as the pixel definition layer, and the sixth dam foundation is arranged in the same layer as the seventh dam foundation; the second dam foundation is arranged on the second power supply portion, the fourth dam foundation is arranged on the auxiliary power supply line covering the second dam foundation and an orthographic projection of the fourth dam foundation on the substrate covers an orthographic projection of the second dam foundation on the substrate, and the sixth dam foundation is arranged on the fourth dam foundation and the orthographic projection of the fourth dam foundation on the substrate covers an orthographic projection of the sixth dam foundation on the substrate; and the second dam foundation, the auxiliary power supply line covering the second dam foundation, the fourth dam foundation and the sixth dam foundation form a first isolation dam.

In some possible implementations, an orthographic projection of the first isolation dam on a substrate at least partially overlaps with the clock signal line.

In a second aspect, the present disclosure further provides a display apparatus, including the display substrate described above.

In a third aspect, the present disclosure further provides a method for preparing a display substrate, which is arranged for preparing the display substrate described above, wherein the display substrate includes display area and an edge area located around the display area, and the preparation method includes: providing the substrate; and sequentially forming a first power supply portion and a second power supply portion on the substrate to form a power supply line located in the edge area, an orthographic projection of the second power supply portion on the substrate being at least partially overlapped with an orthographic projection of the first power supply portion on the substrate, and a distance between an end of the second power supply portion away from the display area and the display area being greater than or being equal to a distance between an end of the first power supply portion away from the display area and the display area.

In some possible implementations, sequentially forming the first power supply portion and the second power supply portion on the substrate includes:

forming a pixel driving circuit in a display area on the substrate, a first driving circuit and a second driving circuit located in the circuit region, a third driving circuit located in the third circuit region, a first power supply portion and a crack detection line located in the isolation dam region;

forming a first planarization layer located in the display area and the circuit region and a first dam foundation and a first protective layer located in the isolation dam region on the substrate on which the first power supply portion is formed;

forming a connection electrode located in a display area and a second power supply portion located in a circuit region and an isolation dam region on the substrate on which the first planarization layer is formed;

forming a second planarization layer located in the display area and the circuit region, a second dam foundation, a third dam foundation and a second protective layer located in the isolation dam region on the substrate on which the second power supply portion is formed;

forming an anode located in a display area and an auxiliary power supply line located in an edge area on the substrate on which the second planarization layer is formed;

forming a pixel definition layer located in a display area, an isolation layer located in a circuit region, and a fourth dam foundation and a fifth dam foundation located in an isolation dam region on the substrate on which the auxiliary power supply line is formed;

and forming an organic light emitting layer located in the display area, a cathode located in the display area and the circuit region, and a sixth dam foundation and a seventh dam foundation located in the isolation dam region on the substrate on which the pixel definition layer is formed.

Other aspects may be understood upon reading and understanding the drawings and the detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales, but are only intended to schematically illustrate contents of the present disclosure.

DETAILED DESCRIPTION

Figure 1:
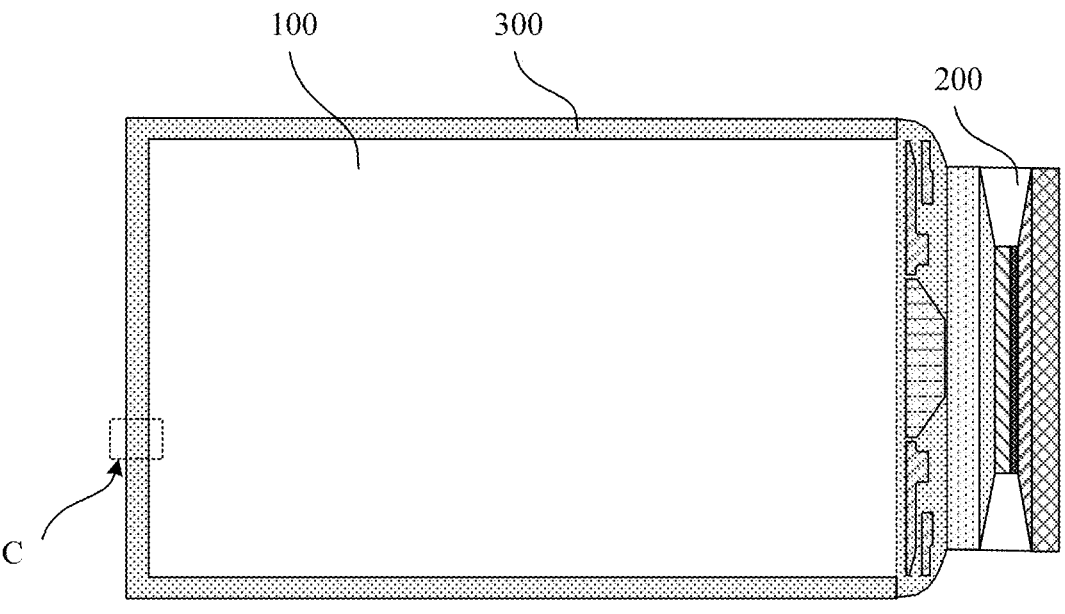
FIG. 1 is a schematic diagram of a structure of a display substrate.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of each constituent element, a thickness of a layer, or a region is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulation layer" sometimes.

In the present disclosure, "about" refers to that a boundary is defined not so strictly and numerical values within process and measurement error ranges are allowed.

A low-temperature polycrystalline oxide display product provides a low-voltage signal to a display area through a power supply line. Because of the impedance of the power supply line and the voltage drop of the voltage signal transmission, the voltage loss of the power supply line reduces the uniformity of the display brightness of the display products and increases the power consumption of the display products, which has become an important factor affecting the high-quality display.

FIG. 1 is a schematic diagram of a structure of a display substrate. As shown in FIG. 1, the display substrate may include a display area 100, a bonding area 200 on a side of the display area 100, and an edge area 300 on other sides of the display area 100.

In an exemplary embodiment, the display area 100 at least includes a plurality of display units (sub-pixels) arranged regularly.

In an exemplary embodiment, within a plane perpendicular to the display substrate, a display unit may include a driving structure layer arranged on a substrate, a light emitting device arranged on the driving structure layer, and an encapsulation layer arranged on the emitting device. Among them, the driving structure layer may include a pixel driving circuit, the light emitting device is configured to emit light and is connected with the pixel driving circuit, and the pixel driving circuit is configured to drive the light emitting device to emit light.

In an exemplary embodiment, the pixel driving circuit may include a plurality of thin film transistors (abbreviated as TFT) and a storage capacitor, such as 3T1C, 4T1C, 5T1C, 6T1C or 7T1C, which is not limited in the present disclosure.

Figure 2:
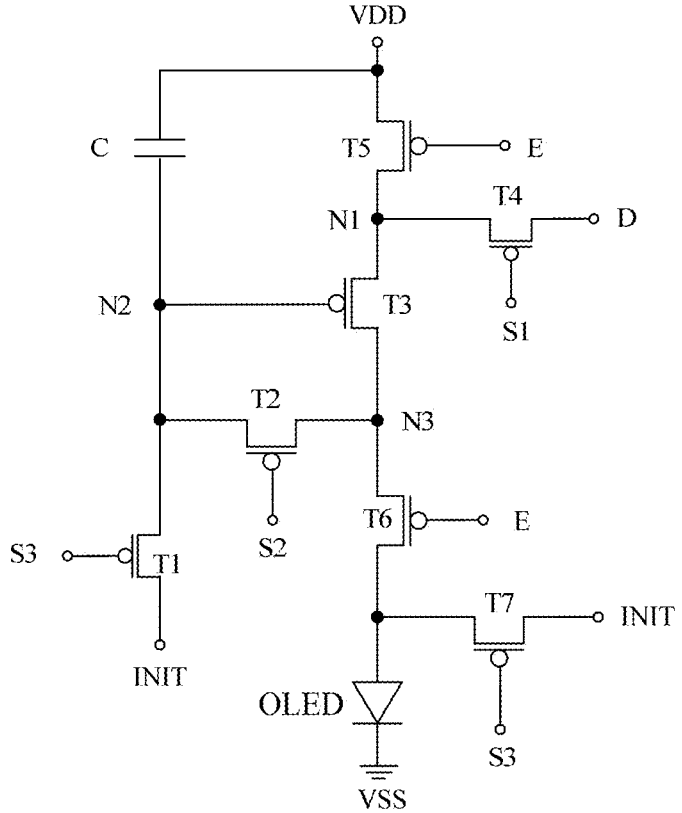
FIG. 2 is a schematic diagram of an equivalent circuit of a pixel drive circuit.

FIG. 2 is a schematic diagram of an equivalent circuit of a pixel driving circuit. As shown in FIG. 2, the pixel driving circuit may include seven transistors (a first transistor T1 to a seventh transistor T7), one storage capacitor C, and seven signal lines (a data signal line D, a first scan signal line S1, a second scan signal line S2, a third scan signal line S3, a light emitting signal line E, an initial signal line INIT, a first power supply line VDD, and a second power supply line VSS).

In an exemplary embodiment, a first end of the storage capacitor C is connected with the first power supply line VDD, and a second end of the storage capacitor C is connected with the second node N2, namely the second end of the storage capacitor C is connected with a control electrode of the third transistor T3.

In an exemplary embodiment, a control electrode of the first transistor T1 is connected to the third scan signal line S3, a first electrode of the first transistor T1 is connected to the initial signal line INIT, and a second electrode of the first transistor is connected to a second node N2. When a scan signal with an on-level is applied to the third scan signal line S3, the first transistor T1 transmits an initialization voltage to the control electrode of the third transistor T3 so as to initialize a charge amount of the control electrode of the third transistor T3.

In an exemplary embodiment, a control electrode of the second transistor T2 is connected with the second scan signal line S2, a first electrode of the second transistor T2 is connected with the second node N2, and a second electrode of the second transistor T2 is connected with a third node N3. The second transistor T2 may be a compensation transistor, and when a scan signal with an on-level is applied to the second scan signal line S2, the second transistor T2 enables the control electrode of the third transistor T3 to be connected with a second electrode of the third transistor T3.

In an exemplary embodiment, the control electrode of the third transistor T3 is connected with the second node N2, namely the control electrode of the third transistor T3 is connected with the second terminal of the storage capacitor C, a first electrode of the third transistor T3 is connected with a first node N1, and the second electrode of the third transistor T3 is connected with the third node N3. The third transistor T3 may be referred to as a driving transistor, and the third transistor T3 determines an amount of a drive current flowing between the first power supply line VDD and the second power supply line VSS according to a potential difference between the control electrode and the first electrode of the third transistor T3.

In an exemplary embodiment, a control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be referred to as a writing transistor, and when a scan signal with an on-level is applied to the first scan signal line S1, the fourth transistor T4 enables a data voltage of the data signal line D to be input to the pixel driving circuit.

In an exemplary embodiment, a control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a driving current path between the first power supply line VDD and the second power supply line VSS.

In an exemplary embodiment, a control electrode of the seventh transistor T7 is connected with the third scan signal line S3, a first electrode of the seventh transistor T7 is connected with the initial signal line INIT, and a second electrode of the seventh transistor T7 is connected with the first electrode of the light emitting device. When a scan signal with an on-level is applied to the third scan signal line S3, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary embodiment, a cathode of the light emitting device is connected with the second power supply line VSS.

In an exemplary embodiment, the first power supply line VDD continuously provides a high level signal, and the second power supply line VSS continuously provides a low level signal.

In an exemplary embodiment, the first transistor T1 to the seventh transistor T7 may include a P-type transistor and an N-type transistor.

In an exemplary embodiment, the first transistor T1 and the second transistor T2 are N-type metal oxide transistors, and the third transistors T3 to the seventh transistors T7 are P-type low-temperature polysilicon thin film transistors.

In an exemplary embodiment, the writing transistor and the compensation transistor have different transistor types.

In an exemplary embodiment, the first scan signal line S1, the second scan signal line S2, the third scan signal line S3, the light emitting signal line E and the initial signal line INIT extend along a first direction, and the second power supply line VSS, the first power supply line VDD and the data signal line D extend along a second direction, the first direction intersecting with the second direction.

In an exemplary embodiment, the light emitting device may be an Organic light emitting Diode (OLED), including a first electrode (anode), an organic light emitting layer, and a second electrode (cathode) that are stacked. The anode of the light emitting device is connected with the pixel driving circuit.

The display substrate provided by the embodiment of the present disclosure may be a low-temperature polycrystalline oxide display substrate.

In an exemplary embodiment, the bonding region 200 at least includes isolation dams and bonding circuits connecting signal lines of plurality of display units to an external drive apparatus, and the edge area 300 at least includes isolation dams, gate driving circuits and a power line for transmitting voltage signals to the plurality of display units. The isolation dams of the bonding region 200 and the edge area 300 form an annular structure surrounding the display area 100.

Figure 3:
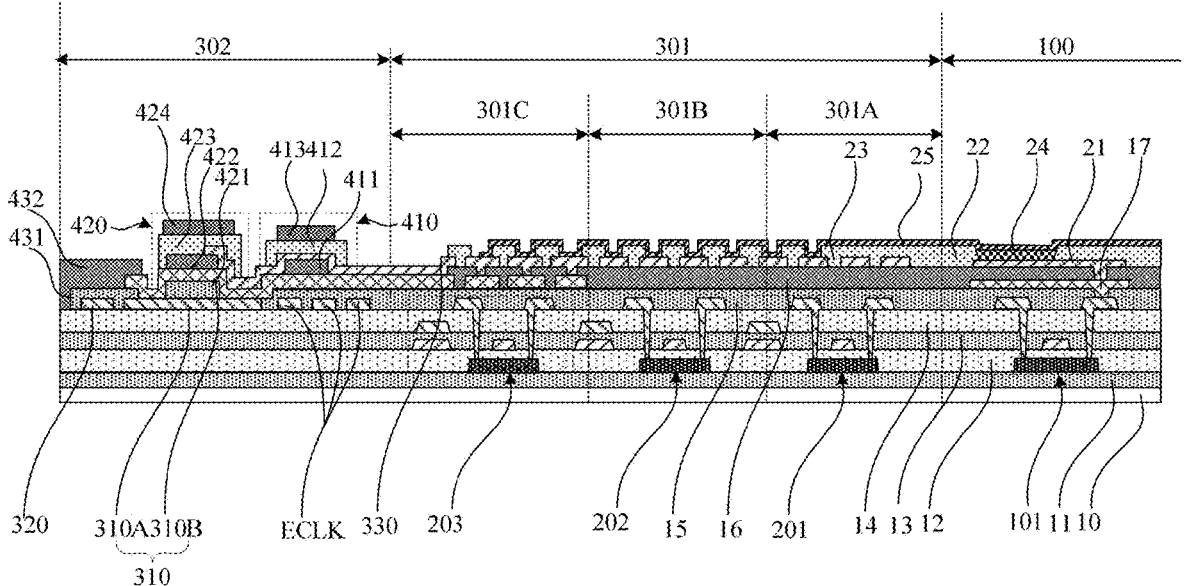
FIG. 3 is a schematic diagram of a structure of a display substrate according to an embodiment of the present disclosure.
Figure 4:
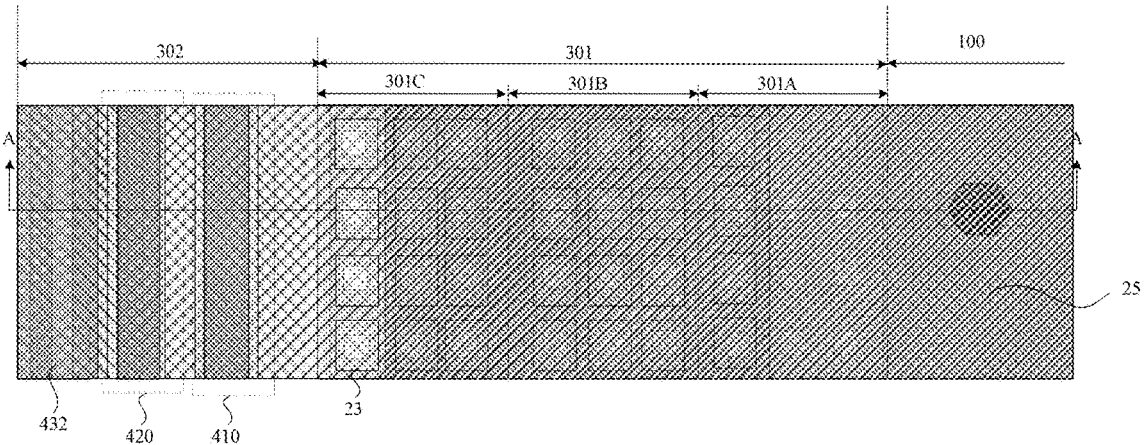
FIG. 4 is a top view of a display substrate according to an embodiment of the present disclosure.
Figure 5:
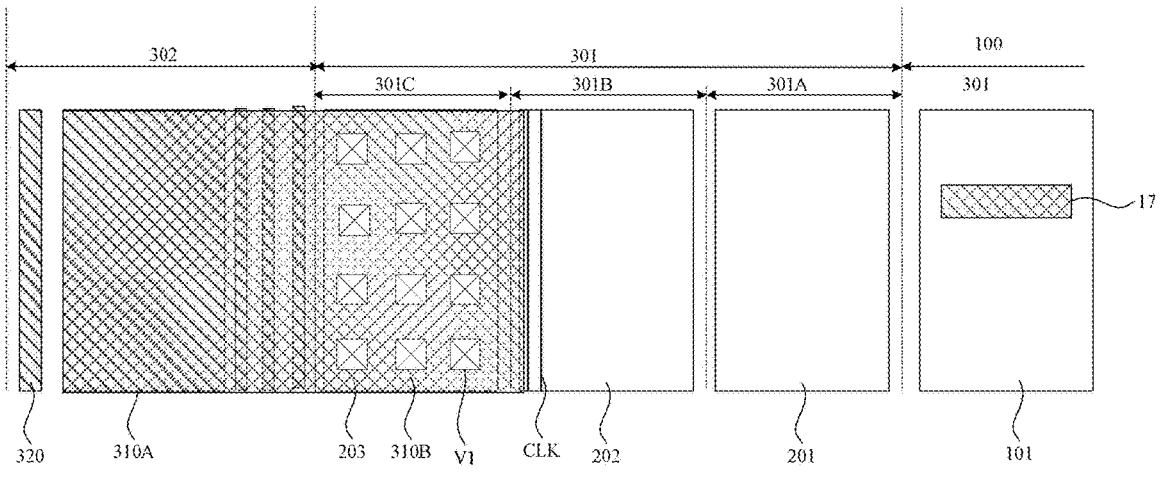
FIG. 5 is a top view of a part of a film layer of a display substrate provided by an embodiment of the present disclosure.

FIG. 3 is a structural schematic diagram of the display substrate provided by the embodiment of the present disclosure, and is an enlarged view of the C area in FIG. 1. FIG. 4 is a top view of the display substrate provided by the embodiment of the present disclosure, and FIG. 3 is a cross-sectional view along an A-A direction of FIG. 4. FIG. 5 is a top view of a part of film layers of the display substrate provided by the embodiment of the present disclosure. As shown in FIG. 3 to FIG. 5, in a direction parallel to the display substrate, the edge area 300 includes a circuit region 301 and an isolation dam region 302 which are sequentially arranged along a direction away from the display area 100. The circuit region 301 includes a first circuit region 301A, a second circuit region 301B, and a third circuit region 301C that are sequentially arranged along a direction away from the display area 100.

In an exemplary embodiment, the circuit region 301 includes at least a gate driving circuit. Among them, the gate driving circuit is electrically connected to the first scan signal line, the second scan signal line and the light emitting signal line of the pixel driving circuit 101 in the display area 100 respectively.

In an exemplary embodiment, the gate driving circuit located in the edge area 300 may include a first driving circuit 201, a second driving circuit 202 and a third driving circuit 203.

In an exemplary embodiment, the first driving circuit 201 is electrically connected to a first scan signal line.

In an exemplary embodiment, the second driving circuit 202 is electrically connected to a second scan signal line. Among them, the second driving circuit 202 may further include a clock signal line CLK.

In an exemplary embodiment, the third driving circuit 203 is electrically connected to a light emitting signal line and may further include a clock signal line ECLK.

In an exemplary embodiment, the first driving circuit 201 may have an 8T2C circuit structure or other circuit structures.

In an exemplary embodiment, a second driving circuit 202 may have a 10T3C circuit structure or a 13T3C circuit structure, which is not limited in the present disclosure.

In an exemplary embodiment, the first driving circuit 201 is located in the first circuit region 301A, the second driving circuit 202 is located in the second circuit region 301B, and the third driving circuit 203 is located in the third circuit region 301C and the isolation dam region 302.

In an exemplary embodiment, the isolation dam region 302 at least includes a power supply line 310 connected to a cathode of the light emitting device, a first isolation dam 410, a second isolation dam 420, a crack detection line 320, and a clock signal line ECLK of the third driving circuit 203.

In an exemplary embodiment, the power supply line 310 extends along a direction parallel to an edge of a display area and is connected to a second power supply line VSS of a pixel driving circuit 101 in the display area 100.

In an exemplary embodiment, the power supply line 310 includes a first power supply portion 310A and a second power supply portion 310B connected to each other, wherein the second power supply portion 310B is located on a side of the first power supply portion 310A away from the substrate.

In an exemplary embodiment, an orthographic projection of the second power supply portion 310B on the substrate overlaps at least partially with an orthographic projection of the first power supply portion 310A on the substrate, and a distance between an end of the second power supply portion 310B away from the display area 100 and the display area 100 is greater than or equal to a distance between an end of the first power supply portion 310A away from the display area 100 and the display area 100.

In an exemplary embodiment, the first power supply portion 310A is located in an isolation dam region 302.

In an exemplary embodiment, the second power supply portion 310B is located at least in an isolation dam region 302 and a third circuit region 301C. The second power supply portion 310B may be located in a second circuit region 301B, wherein an orthographic projection of the second power supply portion 310B on the substrate overlaps at least partially an orthographic projection of the third driving circuit 203 on the substrate, and has no overlapping area with an orthographic projection of the second driving circuit 202 on the substrate.

In an exemplary embodiment, the second driving circuit includes a clock signal line CLK. A distance between an end of the second power supply portion 310B close to an end of a display area 100 and the display area 100 is greater than a distance between an end of the clock signal line CLK away from the display area 100 and the display area 100. That is, there is no overlapping area between an orthographic projection of the second power supply portion 310B on the substrate and an orthographic projection of the clock signal line CLK on the substrate.

In an exemplary embodiment, the crack detection line 320 extends along a direction parallel to an edge of a display area and is located on a side of a power supply line 310 away from the display area 100. The crack detection line is arranged to detect whether there is a crack in the display substrate.

In an exemplary embodiment, the first isolation dam 410 and second isolation dam 420 extend along a direction parallel to an edge of a display area and are configured to block water vapor entering the display area 100 from an edge area 300.

In an exemplary embodiment, a distance between a first isolation dam 410 and a display area 100 is less than a distance between a second isolation dam 420 and the display area 100. That is, the second isolation dam 420 is arranged on a side of the first isolation dam 410 away from the display area 100.

In an exemplary embodiment, the needed low voltage of a light emitting device connected with the pixel driving circuit in the display area 100 is introduced from a bonding pad of the bonding area 200, enters the edge area 300 after passing through the bonding area 200, and is transmitted to the second power supply line VSS of each pixel driving circuit through the annular power supply line 310 of the edge area 300.

In the present disclosure, FIG. 3 illustrates a cross-sectional structure of a display area and a peripheral area of a top emission type OLED. According to a light emission direction, OLED can be categorized as a bottom-emission type, a top-emission type and a double-sided emission type. Compared with bottom-emission OLED, top-emission OLED has advantages of high aperture ratio, high color purity and easy to achieve high pixels per inch (abbreviated as PPI), which has gradually become a mainstream structure at present. For the top-emission OLED, because the light exit direction is at a cathode side, in order to ensure a good light transmittance, the cathode is required to be very thin, therefore, the voltage drop of the power supply line providing a low voltage for the cathode has an important effect on improving the uniformity of the display brightness.

As shown in FIG. 3 to FIG. 6, combined with FIG. 7 to FIG. 22, the display substrate of an exemplary embodiment of the present disclosure includes a display area 100 and an edge area 300, wherein the edge area 300 includes a circuit region 301, and an isolation dam region 302 which are sequentially arranged along a direction away from the display area 100.

In an exemplary embodiment, the display area 100 of the display substrate includes: a substrate 10; a first insulation layer 11 arranged on the substrate 10; an active layer arranged on the first insulation layer 11, the active layer at least including a first active layer; a second insulation layer 12 covering the active layer; a first gate metal layer, a third insulation layer 13, a second gate metal layer and a fourth insulation layer 14 arranged sequentially on the second insulation layer 12, the first gate metal layer including at least a first gate electrode; and the second insulation layer 12, the third insulation layer 13, and the fourth insulation layer 14 being provided with vias exposing the first active layer.

A first source-drain metal layer arranged on the fourth insulation layer 14, wherein the source-drain metal layer at least includes a first source electrode and a first drain electrode, and the first source electrode and the first drain electrode are respectively connected to the first active layer through the vias exposing the first active layer; a first organic layer arranged on the first source-drain metal layer, the first organic layer at least comprises: a first planarization layer 15 covering the first source-drain metal layer, the first planarization layer 15 being provided with a first via exposing the first drain electrode; a second source-drain electrode layer arranged on the first organic layer, wherein the second source-drain metal layer at least includes a connection electrode 17 arranged on the first planarization layer 15, the connection electrode 17 being connected with the first drain electrode through the first via; a second organic layer arranged on the second source-drain electrode layer, wherein the second organic layer at least includes a second planarization layer 16 covering the connection electrode 17, on which a second via exposing the connection electrode 17 is provided; a transparent conductive layer arranged on the second organic layer, wherein the transparent conductive layer at least includes an anode 21 arranged on the second planarization layer 16, the anode 21 being connected with the connection electrode 17 through the second via; a third organic layer arranged on the transparent conductive layer, wherein the third organic layer at least includes a pixel definition layer 22 arranged on the anode 21, the pixel definition layer 22 being provided with a fifth via exposing the anode 21; an organic light emitting layer 24 arranged in the fifth via, wherein the organic light emitting layer 24 is connected to the anode 22; a cathode 25 arranged on the organic light emitting layer 24 and the pixel definition layer 22, wherein the cathode 25 is connected to the organic light emitting layer 24.

In an exemplary embodiment, the edge area 300 of the display substrate includes: a substrate 10; a first insulation layer 11 arranged on the substrate 10; an active layer arranged on the first insulation layer 11, wherein the active layer at least includes a second active layer, a third active layer and a fourth active layer located in a circuit region 301; a second insulation layer 12 covering the active layer; a first gate metal layer arranged on the second insulation layer 12, wherein the first gate metal layer at least includes a second gate electrode and a first capacitive electrode located in a first circuit region 301A, a third gate electrode and a second capacitive electrode located in a second circuit region 301B, a fourth gate electrode and a third capacitive electrode located in a third circuit region 301C; a third insulation layer 13 covering the first metal gate layer; a second gate metal layer arranged in the third insulation layer 13, wherein the second gate metal layer includes at least a fourth capacitive electrode located in the first circuit region 301A, a fifth capacitive electrode located in the second circuit region 301B, and a sixth capacitive electrode located in the third circuit region 301C;

a fourth insulation layer 14 covering the second gate metal layer, wherein a plurality of vias exposing the second active layer, the third active layer and the fourth active layer are provided on the fourth insulation layer 14 of the circuit region 301;

a first source-drain metal layer arranged on the fourth insulation layer 14, wherein the first source-drain metal layer at least includes a second source electrode, a second drain electrode, a third source electrode, a third drain electrode, a fourth source electrode and a fourth drain electrode located in the circuit region 301, and a power supply portion 310A, a clock signal line ECLK and a crack detection line 320 located in the isolation dam region 302; the second source electrode and the second drain electrode being respectively connected to the second active layer through the via exposing the second active layer, the third source electrode and the third drain electrode being respectively connected to the third active layer through the via exposing the third active layer, and the fourth source electrode and the fourth drain electrode being respectively connected to the fourth active layer through the via exposing the fourth active layer;

a first organic layer arranged on the first source-drain metal layer, wherein the first organic layer at least includes a first planarization layer 15 located in the circuit region 301 and the isolation dam region 302, and a first dam foundation 421 and a first protective layer 431 formed in the isolation dam region 302; the first dam foundation 421 of the isolation dam region 302 being arranged on the first power supply portion 310A, the first protective layer 431 being arranged on the crack detection line 320 and the first power supply portion 310A, the first protective layer 431 covering the crack detection line 320 and covering an end of the first power supply portion 310A far away from the display area, and the first planarization layer 15 covering the clock signal line ECLK;

a second source-drain electrode layer arranged on the first organic layer, wherein the second source-drain metal layer at least includes a second power supply portion 310B located in the isolation dam region 302, the second power supply portion 310B on which is provided with a second via exposing the first planarization layer covering the first dam foundation 421;

a second organic layer arranged on the second source-drain electrode layer, wherein the second organic layer at least includes a second planarization layer 16 in the circuit region 301, and a second dam foundation 411, a third dam foundation 422 and a second protective layer 432 arranged in the isolation dam region 302, the third dam foundation 422 being arranged on the second power supply portion 310B covering the first dam foundation 421, the second dam foundation 411 being arranged on the second power supply portion 310B located at a side of the first dam foundation 421 adjacent to the display area 100, the second protective layer 432 being arranged on the first protective layer 431 and covering an end of the second power supply portion 310B far away from the display area, and the second planarization layer 16 being provided with a fourth via exposing the second power supply portion 310B;

a transparent conductive layer arranged on the second organic layer, wherein the transparent conductive layer at least includes an auxiliary power supply line 330 located in the circuit region 301 and the isolation dam region 302, a plurality of fifth vias being provided in the auxiliary power supply line 330 located in the circuit region 301; the auxiliary power supply line 330 in the isolation dam region 302 covering the second dam foundation 411 and partially covering the third dam foundation 422; both the auxiliary power supply line 330 located on a side of the second dam foundation 411 adjacent to the display area 100 and the auxiliary power supply line 330 located on a side of the second dam foundation 402 away from the display area 100 being lapped on the second power supply portion 310B;

a third organic layer arranged on the transparent conductive layer, wherein the third organic layer at least includes an isolation layer 23 located in the circuit region 301, and a fourth dam foundation 412 and a fifth dam foundation 423 located in the isolation dam region 302, the isolation layer 23 being provided with a seventh via exposing the auxiliary power supply line 330, the fourth dam foundation 412 being arranged on the auxiliary power supply line 330 covering the second dam foundation 411, and a fifth dam foundation 423 being arranged on the third dam foundation 422;

a cathode 25 arranged in the circuit region 301, wherein the cathode 25 is electrically connected to the auxiliary power supply line 330 through a seventh via;

and a sixth dam foundation 413 and a seventh dam foundation 424 arranged in the isolation dam region 302, wherein the sixth dam foundation 413 is located on the fourth dam foundation 412, and the seventh dam foundation 424 is located on the fifth dam foundation 423.

In an exemplary embodiment, the sixth dam foundation 413 and the seventh dam foundation 424 may be multiplexed as post spacers.

The second dam foundation 402, the auxiliary power supply line 330 covering the second dam foundation, the fourth dam foundation 412, and the sixth dam foundation 413 form a first isolation dam 410.

In an exemplary embodiment, the first dam foundation 421, the second power source portion 310B covering the first dam foundation, the third dam foundation 422, the fifth dam foundation 423, and the seventh dam foundation 424 form a second isolation dam 420.

Figure 6:
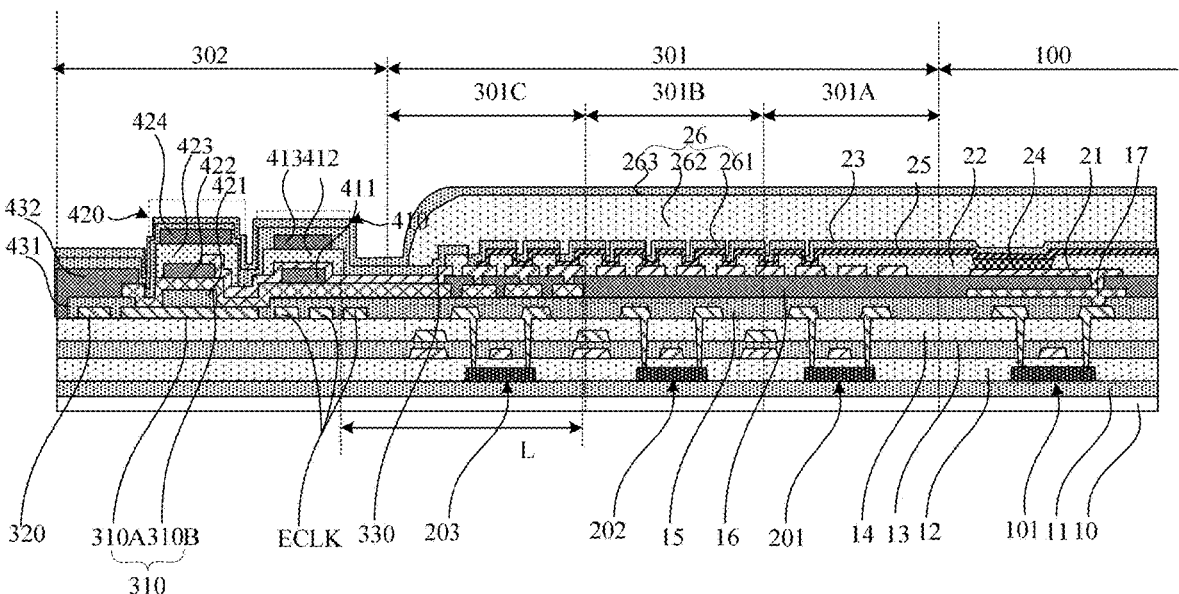
FIG. 6 is a schematic diagram of a structure of a display substrate according to an exemplary embodiment.

FIG. 6 is a first schematic diagram of a structure of a display substrate according to an exemplary embodiment. As shown in FIG. 6, a display substrate provided by an exemplary embodiment further includes an encapsulation layer 26. The encapsulation layer 26 may include a first encapsulation layer 261, a second encapsulation layer 262, and a third encapsulation layer 263 which are stacked sequentially on the substrate. The encapsulation layer of the display area 100 and the circuit region 301 has a stacked structure of a first encapsulation layer/a second encapsulation layer/a third encapsulation layer, and the encapsulation layer of the isolation dam region 302 has a stacked structure of a first encapsulation layer/a third encapsulation layer.

Exemplary description is made below through a preparation process for the display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being arranged on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" refers to a boundary of the orthographic projection of B falling within a range of a boundary of the orthographic projection of A, or a boundary of the orthographic projection of A is overlapped with a boundary of the orthographic projection of B.

In an exemplary embodiment, as show in FIG. 7 to FIG. 22, the display substrate includes a display area 100 and an edge area 300, and the edge area 300 includes a circuit region 301 and an isolation dam region 302 which are sequentially arranged along a direction away from the display area 100. The circuit region 301 includes a first circuit region 301A, a second circuit region 301A, and a third circuit region 301C that are sequentially arranged along a direction away from the display area 100. The display area 100 includes a pixel driving circuit 101; the first circuit region 301A includes a first driving circuit 201; the second circuit region 301A includes a second driving circuit 202; and the isolation dam region 302 and the third circuit region 301C include a third driving circuit 203. A plurality of transistors and at least one capacitor are at least included in the pixel driving circuit 101, the first driving circuit 201, the second driving circuit 202 and the third driving circuit 203, and only one transistor in the pixel driving circuit and one transistor and one capacitor in the first driving circuit to third driving circuit are shown as in FIG. 7 to FIG. 22.

Figure 7:
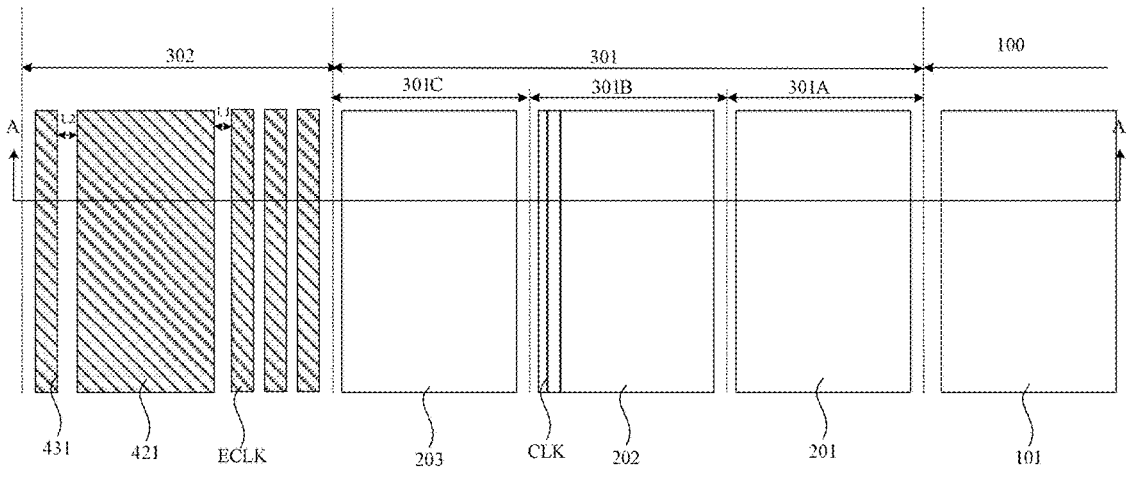
FIG. 7 is a schematic diagram after a display circuit layer is formed.
Figure 8:
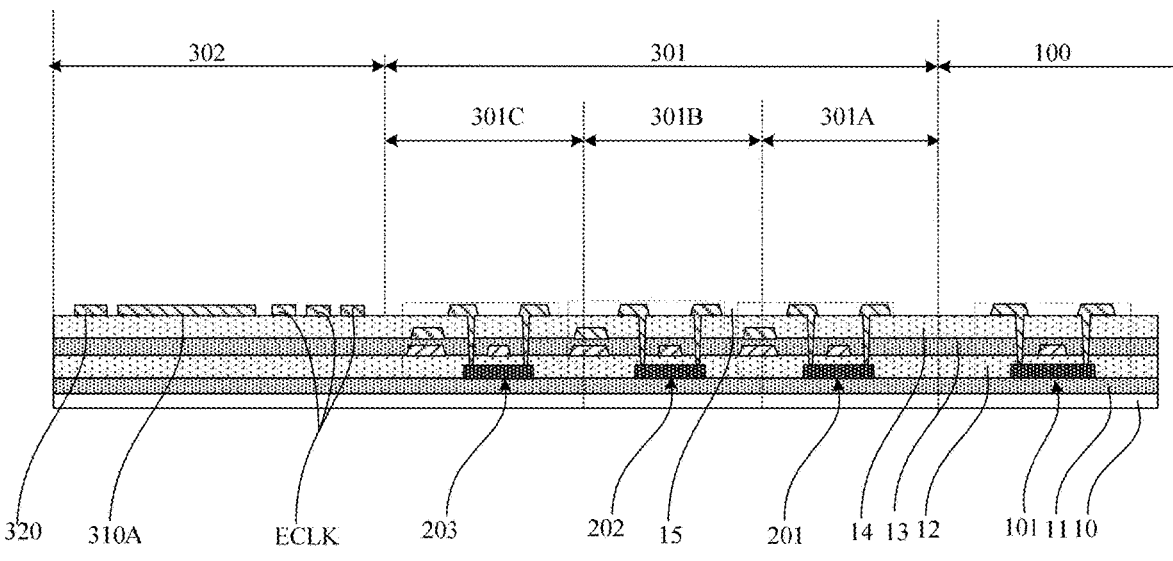
FIG. 8 is a cross-sectional view along an A-A direction of FIG. 7.

A preparation process of a display substrate provided by an exemplary embodiment may include:

(1) providing a substrate 10 and preparing patterns of a display circuit layer on the substrate 10, wherein the patterns of the display circuit layer includes the patterns of a driving structure layer located in a display area 100 and a circuit structure layer located in a peripheral area 300. The driving structure layer of the display area 100 includes a pixel driving circuit 101, and the circuit structure layer of the peripheral area 300 includes a first driving circuit 201 located in a first circuit region 301A, a second driving circuit 202 located in a second circuit region 301B, and a third driving circuit 203 located in a third circuit region 301C, and the circuit structure layer further includes a first power supply portion 310A, a clock signal line ECLK of the third driving circuit 203 and the crack detection line 320 located in the isolation dam region 302, as shown in FIG. 7 and FIG. 8. FIG. 7 is a schematic diagram after the display circuit layer is formed, and FIG. 8 is a cross-sectional view along the A-A direction of FIG. 7.

In an exemplary embodiment, the substrate 10 may include a first flexible material layer, a first inorganic material layer, a semiconductor layer, a second flexible material layer, and a second inorganic material layer which are stacked. Materials of the first flexible material layer and second flexible material layer may be polyimide (PI), polyethylene terephthalate (PET), or a polymer soft film subjected to surface treatment, etc. Materials of the first inorganic material layer and second inorganic material layer may be silicon nitride (SiNx), silicon oxide (SiOx), or the like, so as to improve water-oxygen resistance capability of the substrate. The first inorganic material layer and second inorganic material layer are also referred to as barrier layers. A material of the semiconductor layer may be amorphous silicon (a-si). After this process, both the display area 100 and the peripheral area 300 include the substrate 10.

In an exemplary embodiment, a preparation process of the display circuit layer may include: sequentially depositing a first insulation thin film and a semiconductor film on the substrate 10, and patterning the semiconductor film by a patterning process to form a first insulation layer 11 covering the whole substrate 10 and form a semiconductor layer pattern arranged on the first insulation layer 11, wherein the semiconductor layer pattern at least includes a first active layer located in the display area 100, a second active layer located in a first circuit region 301A, a third active layer located in a second circuit region 301B and a fourth active layer located in a third circuit region 301C.

Then, sequentially depositing a second insulation thin film and a first metal thin film, and patterning the first metal thin film by a patterning process to form a second insulation layer 12 covering the pattern of the semiconductor layer and covering the whole substrate, and form a pattern of a first gate metal layer arranged on the second insulation layer 12, wherein the pattern of the first gate metal layer at least includes a first gate electrode located in the display area 100, a second gate electrode and a first capacitive electrode located in the first circuit region 301A, a third gate electrode and a second capacitive electrode located in the second circuit region 301B, and a fourth gate electrode and a third capacitive electrode located in the third circuit region 301C.

Subsequently, sequentially depositing a third insulation thin film and a second metal thin film, and patterning the second metal thin film by a patterning process to form a third insulation layer 13 covering the pattern of the first gate metal layer and covering the whole substrate, and form a pattern of a second gate metal layer arranged on the third insulation layer, wherein the pattern of the second gate metal layer at least includes a fourth capacitive electrode located in first circuit region 301A, a fifth capacitive electrode located in second circuit region 301B, a sixth capacitive electrode located in third circuit region 301C.

In an exemplary embodiment, an orthographic projection of the first capacitive electrode on the substrate at least partially overlaps with an orthographic projection of the fourth capacitive electrode on the substrate, and the first capacitive electrode and the fourth capacitive electrode form a capacitor in the first driving circuit.

In an exemplary embodiment, an orthographic projection of the second capacitive electrode on the substrate at least partially overlaps with an orthographic projection of the fifth capacitive electrode on the substrate, and the second capacitive electrode and the fifth capacitive electrode form a capacitor in the second driving circuit.

In an exemplary embodiment, an orthographic projection of the third capacitive electrode on the substrate at least partially overlaps with an orthographic projection of the sixth capacitive electrode on the substrate, and the third capacitive electrode and the sixth capacitive electrode form a capacitor in the third driving circuit.

Then, a fourth insulation thin film is deposited, and the fourth insulation thin film is patterned by a patterning process to form a fourth insulation layer 14 covering a pattern of the second metal layer and covering the whole substrate. Among them, the second insulation layer 12, the third insulation layer 13, and the fourth insulation layer 14 are provided with vias exposing a first active layer in a display area 100, vias exposing a second active layer in a first circuit region 301A, vias exposing a third active layer in a second circuit region 301B, and vias exposing a fourth active layer in a third circuit region 301C.

Subsequently, a third metal thin film is deposited, and the third metal thin film is patterned by a patterning process to form a pattern of a first source-drain metal layer on the fourth insulation layer 14, wherein the pattern of the first source-drain metal layer at least includes a first source electrode and a first drain electrode located in the display area 100, a second source electrode and a second drain electrode located in the first circuit region 301A, a third source electrode and a third drain electrode located in the second circuit region 301B, a fourth source electrode and a fourth drain electrode located in the third circuit region 301C, a first power supply portion 310A, a clock signal line ECLK of the third driving circuit, and a crack detection line 320 which are formed in the isolation dam region 302.

In an exemplary embodiment, a first power supply portion 310A, a clock signal line ECLK of the third driving circuit and a crack detection line 320 which are formed in the isolation dam region 302 are arranged on the fourth insulation layer 14, wherein the crack detection line 320 is arranged at an end of the first power supply portion 310A away from the display area 100, and the clock signal line ECLK of the third driving circuit is located at an end of the first power supply portion 310A close to the display area 100.

In an exemplary embodiment, the first source electrode and the first drain electrode are connected to a first active layer through vias of a second insulation layer 12, a third insulation layer 13 and a fourth insulation layer 14, respectively, the second source electrode and the second drain electrode are connected to a second active layer through the second insulation layer 12, the third insulation layer 13 and the fourth insulation layer 14, respectively, the third source electrode and the third drain electrode are connected to the third active layer through the second insulation layer 12, the third insulation layer 13 and the fourth insulation layer 14, respectively, and the fourth source electrode and the fourth drain electrode are connected to a fourth active layer through the second insulation layer 12, the third insulation layer 13 and the fourth insulation layer 14, respectively.

So far, the pattern of the display circuit layer is prepared on the substrate.

In an exemplary embodiment, the first active layer may include active layers of all transistors in the pixel driving circuit, the first gate electrode may include gate electrodes of active layers of all transistors in the pixel driving circuit, the first source electrode may include source electrodes of all transistors in the pixel driving circuit, and the first drain electrode may include drain electrodes of all transistors in the pixel driving circuit.

In an exemplary embodiment, the second active layer may include active layers of all transistors in the first driving circuit, the second gate electrode may include gate electrodes of active layers of all transistors in the first driving circuit, the second source electrode may include source electrodes of all transistors in the first driving circuit, and the second drain electrode may include drain electrodes of all transistors in the first driving circuit.

In an exemplary embodiment, the third active layer may include active layers of all transistors in the second driving circuit, the third gate electrode may include gate electrodes of active layers of all transistors in the second driving circuit, the third source electrode may include source electrodes of all transistors in the second driving circuit, and the third drain electrode may include drain electrodes of all transistors in the second driving circuit.

In an exemplary embodiment, the fourth active layer may include active layers of all transistors in the third driving circuit, the fourth gate electrode may include gate electrodes of active layers of all transistors in the third driving circuit, the fourth source electrode may include source electrodes of all transistors in the third driving circuit, and the fourth drain electrode may include drain electrodes of all transistors in the third driving circuit.

In an exemplary embodiment, a distance L1 between the first power supply portion 310A and the third driving circuit 203 is greater than or equal to 3 microns and less than or equal to 5 microns, and as an example, the distance between the first power supply portion 310A and the third driving circuit 203 may be 4 microns, which is not limited in this disclosure.

In an exemplary embodiment, a distance L1 between the first power supply portion 310A and the third driving circuit 203 may refer to a shortest distance between the first power supply portion and a clock signal line ECLK of the third driving circuit.

In an exemplary embodiment, a distance L2 between the first power supply portion 310A and the crack detection line 320 is greater than or equal to 3 microns and less than or equal to 5 microns, and as an example, the distance between the first power supply portion 310A and the crack detection line 320 may be 4 microns, which is not limited in this disclosure.

In an exemplary embodiment, a distance L1 between the first power supply portion 310A and the third driving circuit 203 may be equal to or may not be equal to a distance L2 between the first power supply portion 310A and the crack detection line 320, which is not limited in this disclosure.

In an exemplary embodiment, a thickness of the first source-drain metal layer may be about 700 nm to 1000 nm. As an example, the thickness of the first source-drain metal layer may be about 860 nm.

Figure 9:
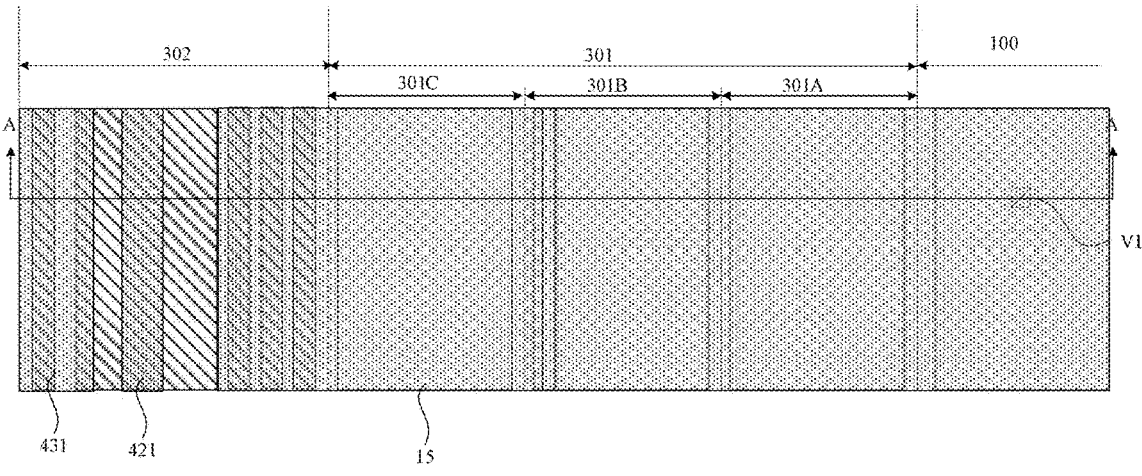
FIG. 9 is a schematic diagram after a first organic layer is formed.
Figure 10:
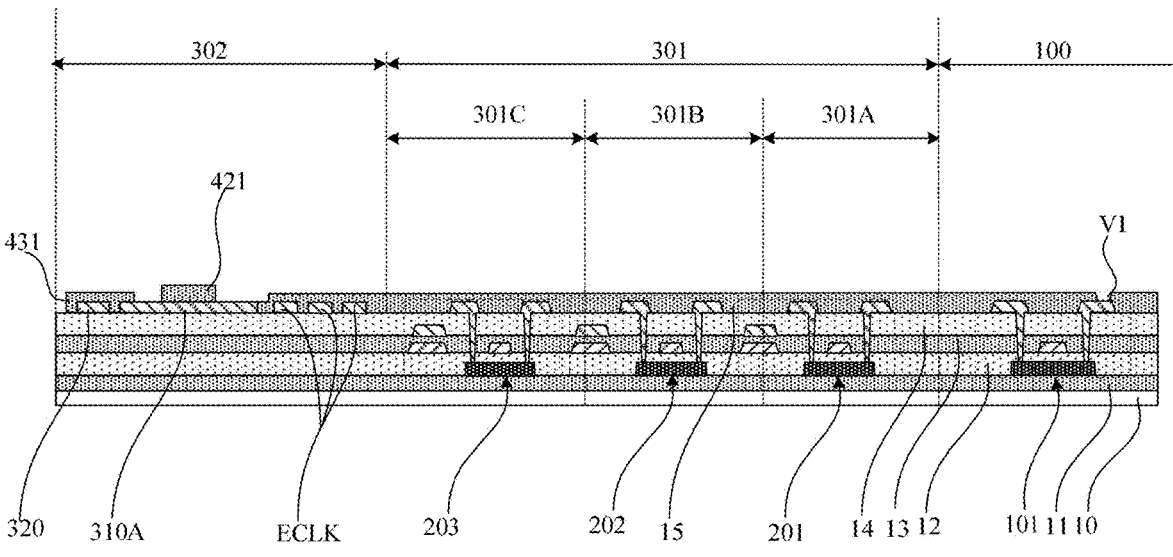
FIG. 10 is a cross-sectional view along an A-A direction of FIG. 9.

(2) Coating a first organic film on a substrate on which the pattern described above is formed, and patterning a first planarization film by a patterning process to form a pattern of a first organic layer, wherein the pattern of the first organic layer includes a first planarization layer 15 located in the display area 100, the circuit region 301, and the isolation dam region 302, and a first dam foundation 421 and a first protective layer 431 located in the isolation dam region 302, as shown in FIG. 9 and FIG. 10. FIG. 9 is a schematic diagram after the first organic layer is formed, and FIG. 10 is a cross-sectional view in the A-A direction of FIG. 9.

In an exemplary embodiment, the first planarization layer 15 is provided with a first via V1 exposing a first drain electrode.

In an exemplary embodiment, an orthographic projection of the first planarization layer 15 on the substrate covers an orthographic projection of a clock signal line ECLK of the third driving circuit on the substrate, and has no overlapping area with an orthographic projection of the first power supply portion 310A on the substrate.

In an exemplary embodiment, in a plane parallel to the display substrate, a shape of the first via V1 may be a triangle, a rectangle, a polygon, a circle, an ellipse, or the like.

In an exemplary embodiment, a shape of the first via V1 may be a rectangular, a length of the rectangle may be about 10 μm to 40 μm, a width of the rectangle may be about 10 μm to 40 μm, and a distance between adjacent first vias V5 may be about 10 μm to 40 μm.

In an exemplary embodiment, a surface of the first planarization layer located in the isolation dam region 302 is not planarization. Among them, the first planarization layer located in the isolation dam region 302 includes a first sub-planarization layer P1 and a second sub-planarization layer P2, wherein the first sub-planarization layer P1 is located on a side of the second sub-planarization layer P2 away from the display area 100, and has a thickness that is smaller than that of the second sub-planarization layer P2.

In an exemplary embodiment, an orthographic projection of the second sub-planarization layer P2 on the substrate covers a third driving circuit 203.

In an exemplary embodiment, a thickness of the first sub-planarization layer P1 may be equal to a thickness of the first power supply portion 310A, and a thickness of the second sub-planarization layer P2 may be equal to a thickness of the first planarization layer located in the display area 100.

In an exemplary embodiment, the first dam foundation 421 is located on a side of the first power supply portion 310A away from the substrate, and an orthographic projection of the first power supply portion 310A on the base overlaps at least partially with an orthographic projection of the first dam foundation 421 on the substrate.

In an exemplary embodiment, a length of the first dam foundation 421 along the first direction is smaller than a length of the first power supply portion 310A along the first direction. That is, both a side of the first dam foundation 421 close to the display area and a side of the first dam foundation 421 away from the display area expose the first power supply portion 310A.

In an exemplary embodiment, the first protective layer 431 is located on a side of the first dam foundation 421 away from the display area 100.

In an exemplary embodiment, an orthographic projection of the first protective layer 431 on the substrate covers an orthographic projection of the crack detection line 320 on the substrate, and at least partially overlaps with an orthographic projection of the first power supply portion 310A on the substrate. That is, the first protective layer 431 covers the crack detection line 320 and an end of the first power supply portion 310A away from the display area 100.

In an exemplary embodiment, a length of the first dam foundation 421 along a first direction may be about 20 μm to 60 μm, and the first dam foundation 421 is configured to form a second isolation dam.

In an exemplary embodiment, in a plane perpendicular to the display substrate, a cross-sectional shape of the first dam foundation 421 may be a trapezoid or a rectangle. When the cross-sectional shape of the first dam foundation 421 is a trapezoid, a length of the surface on a side away from the substrate is smaller than a length of the surface on a side close to the substrate, and the length of the surface on the side away from the substrate may be about 20 μm to 40 μm.

Figure 11:
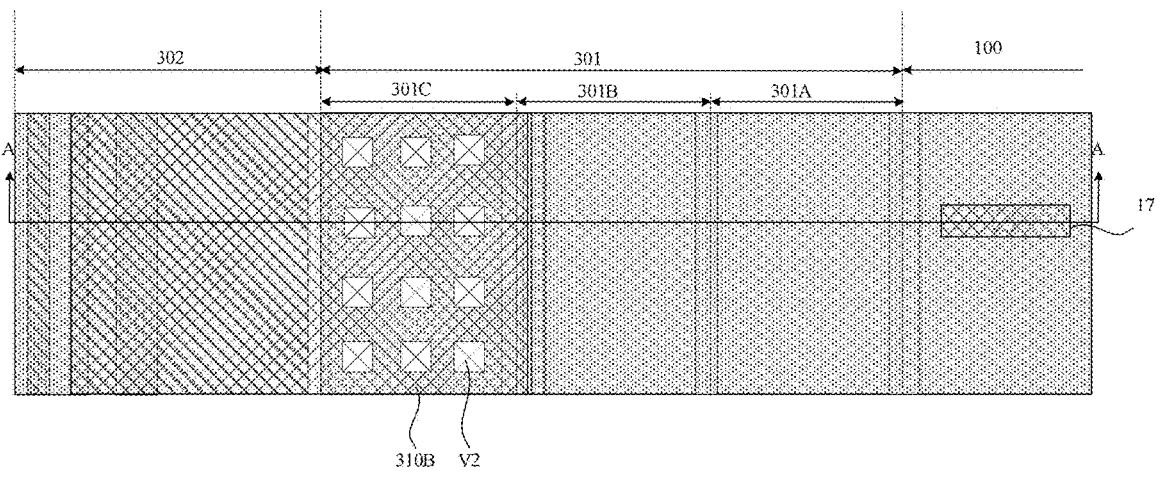
FIG. 11 is a schematic diagram after a second source-drain metal layer is formed.
Figure 12:
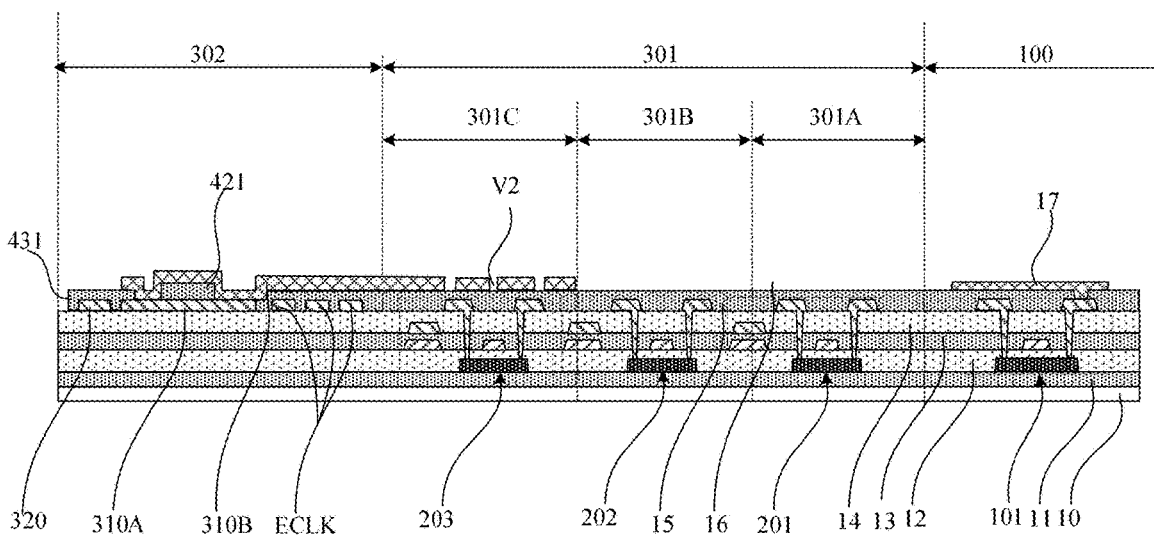
FIG. 12 is a schematic diagram along an A-A direction in FIG. 11.

(3) Depositing a fourth metal film on the substrate on which the pattern described above is formed, and patterning the fourth metal film by a patterning process to form a pattern of a second source-drain metal layer, wherein the pattern of the second source-drain metal layer at least includes a connection electrode 17 located in the display area 100 and a second power supply portion 310B located in the circuit region 301 and the isolation dam region 302, as shown in FIG. 11 and FIG. 12. FIG. 11 is a schematic diagram after the second source-drain metal layer is formed, and FIG. 12 is a schematic diagram along an A-A direction of FIG. 11.

In an exemplary embodiment, the connection electrode 17 is electrically connected to the first drain electrode through a first via V1.

In an exemplary embodiment, the second power supply portion 310B is located at least in an isolation dam region 302 and a third circuit region 301C.

In an exemplary embodiment, the second power supply portion 310B may alternatively be located in a second circuit region 301B.

In an exemplary embodiment, an orthographic projection of the second power supply portion 310B on the substrate covers an orthographic projection of the first power supply portion 310A and the third driving circuit 203 on the substrate and partially overlaps with an orthographic projection of the first protective layer 431 on the substrate.

In an exemplary embodiment, a distance between an end of the second power supply portion 310B away from the display area and the display area may be greater than or equal to a distance between an end of the first power supply portion 310A away from the display area and the display area. FIG. 12 illustrates an example in which a distance between an end of the second power supply portion 310B away from the display area and the display area is equal to a distance between an end of the first power supply portion 310A away from the display area and the display area.

In an exemplary embodiment, there is an overlapping area between an orthographic projection of the second power supply portion 310B on the substrate and an orthographic projection of the second driving circuit on the substrate. A distance between an end of the second power supply portion 310B close to the display area 100 and the display area 100 is greater than a distance between the clock signal line in the second driving circuit 202 and the display area 100. That is, an orthographic projection of the second power supply portion 310B on the substrate does not overlap with an orthographic projection of the clock signal line in the second driving circuit 202 on the substrate, and the orthographic projection of the second power supply portion 310B on the substrate does not overlap with the orthographic projection of the clock signal line in the second driving circuit 202 on the substrate, which may ensure the display effect of the display substrate.

In an exemplary embodiment, the second power supply portion 310B covers a surface of the first dam foundation 421, and is arranged on the first power supply portion 310A exposed on both sides of the first dam foundation 421 to achieve a connection between the second power supply portion 310B and the first power supply portion 310A.

In an exemplary embodiment, a distance between an end of the crack detection line 320 close to the display area and the display area is greater than a distance between an end of the second power supply portion 310B away from the display area and the display area. That is, an orthographic projection of the second power supply portion 310B on the substrate does not overlap with an orthographic projection of the crack detection line 320 on the substrate.

In an exemplary embodiment, the second power supply portion 310B is provided with a plurality of second vias V2 exposing the first planarization layer 15. The second via V2 is arranged to release the gas in the first planarization layer 15 to form a deflation channel, and discharge a gas generated by a planarization film layer during a process, so as to avoid peeling of a film layer and improve the process quality.

In an exemplary embodiment, there are a plurality of second vias V2, and the plurality of second vias V2 are arranged in a matrix to uniformly release the gas in the first planarization layer 15.

In this way, the power supply portion 310A of the first source-drain metal layer and the second power supply portion 310B of the second source-drain metal layer form a double-layer power supply line in an edge area 300. By lapping in the isolation dam region 302, a double-layer power wiring with a parallel structure is achieved, which reduces a resistance of a power wiring in the edge area, minimizes voltage drop of voltage signals, and improves display brightness uniformity of the display area, and thereby improving display quality.

In an exemplary embodiment, a shape of the second via may be a triangle, a rectangle, a polygon, a circle, an ellipse, or the like. In an exemplary embodiment, a shape of the second via may be a rectangular, a length of the rectangle may be about 10 μm to 40 μm, a width of the rectangle may be about 10 μm to 40 μm, and a distance between adjacent second vias may be about 10 μm to 40 μm.

In an exemplary embodiment, the first dam foundation 421 includes a first surface, a first proximal side and a first distal side. The second power supply portion 310B covering the surface of the first dam foundation 401 may refer that the second power supply portion 310B completely covers the first surface, the first proximal side and the first distal side of the first dam foundation 401. That is, the second power supply portion 310B wraps the first surface, the first proximal side and the first distal side of the first dam foundation 401.

In an exemplary embodiment, a thickness of the second source drain metal layer may be about 700 nm to 1000 nm. In some possible embodiments, the thickness of the second source drain metal layer may be about 860 nm.

Figure 13:
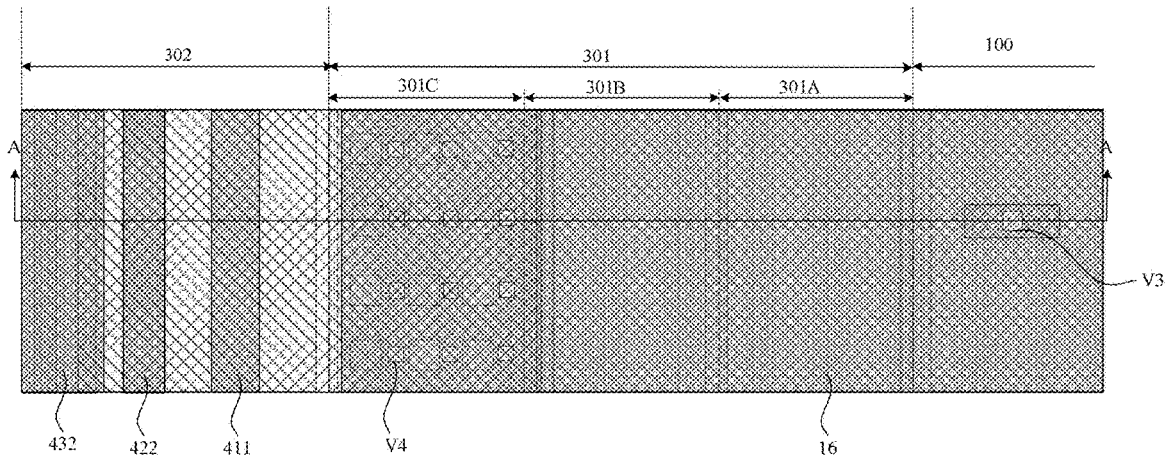
FIG. 13 is a schematic diagram after a second organic layer is formed.
Figure 14:
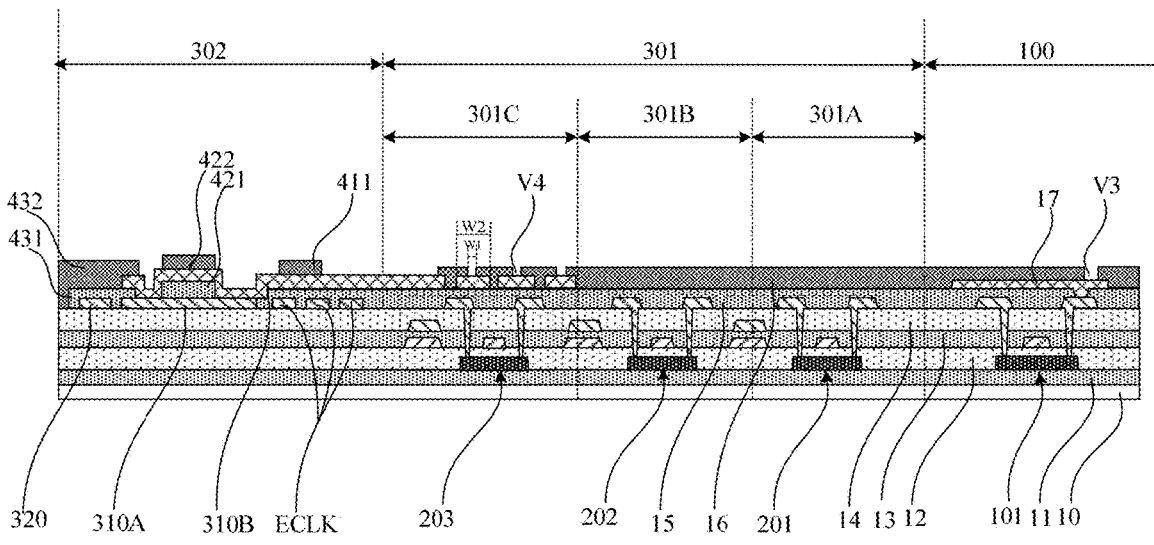
FIG. 14 is a cross-sectional view along an A-A direction of FIG. 13.

(4) Coating a second organic film on a substrate on which the pattern described above is formed, and patterning a second organic film by a patterning process to form a pattern of a second organic layer, wherein the pattern of the second organic layer includes a first planarization layer 16 located in the display area 100 and the circuit region 301, and a second dam foundation 411, a third dam foundation 422 and a second protective layer 432 located in the isolation dam region 302, as shown in FIG. 13 and FIG. 14. FIG. 13 is a schematic diagram after the second organic layer is formed, and FIG. 14 is a cross-sectional view in the A-A direction of FIG. 13.

In an exemplary embodiment, the second planarization layer 16 is provided with a third via V3 exposing the connection electrode 17 and a fourth via V4 exposing a surface of the second power supply portion 310B.

In an exemplary embodiment, an orthographic projection of the fourth via V4 on the substrate does not overlap with an orthographic projection of the second via V2 on the substrate.

In an exemplary embodiment, a width W1 of the fourth Via V4 along a first direction is smaller than a distance W2 between two adjacent second vias arranged in the first direction.

In an exemplary embodiment, in a plane parallel to the display substrate, shapes of the third via V3 and the fourth via V4 may be triangles, rectangles, polygons, circles, ellipses, or the like.

In an exemplary embodiment, shapes of the third via V3 and the fourth via V4 may be rectangles, a length of the rectangles may be about 10 μm to 40 μm, a width of the rectangle may be about 10 μm to 40 μm, and distances between adjacent third vias and adjacent fourth vias may be about 10 μm to 40 μm.

In an exemplary embodiment, the second planarization layer 16 covers an end of the second power supply portion 310B close to the display area 100, and an orthographic projection of the second planarization layer 16 on the substrate covers an orthographic projection of the second via on the substrate.

In an exemplary embodiment, a distance between an end of the second planarization layer 16 away from the display area 100 and the display area 100 is smaller than a distance between an end of the third driving circuit 203 away from the display area 100 and the display area 100, and the distance between the end of the second planarization layer 16 away from the display area 100 and the display area 100 is smaller than a distance between an end of the first planarization layer 15 away from the display area 100 and the display area 100.

In an exemplary embodiment, the second dam foundation 411 is arranged on a second power supply portion 310B on a side of the first dam foundation 421 adjacent to the display area 100.

In an exemplary embodiment, an orthographic projection of the second dam foundation 411 on the substrate at least partially overlaps with an orthographic projection of a clock signal line of the third driving circuit on the substrate.

In an exemplary embodiment, a side of the second dam foundation 411 adjacent to the display area 100 and a side of the second dam foundation 411 away from the display area 100 both expose the second power supply portion 310B.

In an exemplary embodiment, in a plane perpendicular to the display substrate, a cross-sectional shape of the second dam foundation 411 may be a trapezoid or a rectangle. When the cross-sectional shape of the second dam foundation 411 is a trapezoid, a length of the surface of the second dam foundation 411 on a side away from the substrate is smaller than a length of the surface of the second dam foundation 411 on a side close to the substrate, and the length of the surface on the side away from the substrate may be about 20 μm to 40 μm.

In an exemplary embodiment, a length of the second dam foundation 411 along a first direction may be about 20 μm to 60 μm, and the second dam foundation 411 is configured to form a first isolation dam.

In an exemplary embodiment, the third dam foundation 422 is arranged on a second power source portion 310B covering the first dam foundation 421, and an orthographic projection of the third dam foundation 422 on the substrate covers an orthographic projection of the first dam foundation 421 on the substrate.

In an exemplary embodiment, in a plane perpendicular to the display substrate, a cross-sectional shape of the third dam foundation 422 may be a trapezoid or a rectangle. When the cross-sectional shape of the third dam foundation 422 is a trapezoid, a length of the surface of the third dam foundation 422 on a side away from the substrate is smaller than a length of the surface of the third dam foundation 422 on a side close to the substrate, and the length of the surface on the side away from the substrate may be about 20 μm to 40 μm.

In an exemplary embodiment, an orthographic projection of the second protective layer 432 on the substrate covers an orthographic projection of the first protective layer 431 on the substrate. That is, the second protective layer 432 covers an end of the second power supply portion 310B away from the display area 100.

In an exemplary embodiment, a length of the third dam foundation 422 along a first direction may be about 20 μm to 60 μm, and the first dam foundation 421 and the third dam foundation 422 are configured to form a second isolation dam.

Figure 15:
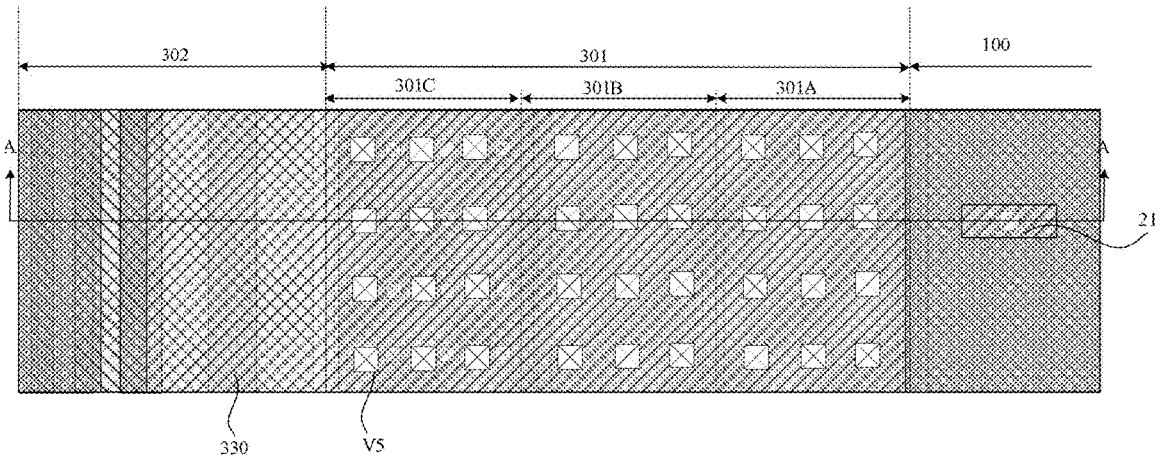
FIG. 15 is a schematic diagram after a transparent conductive layer is formed.
Figure 16:
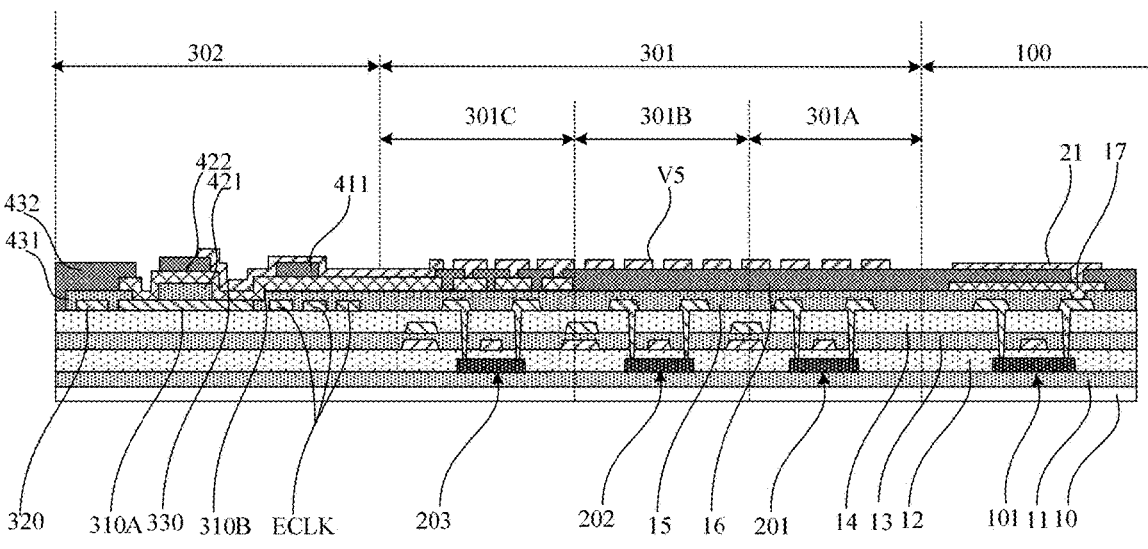
FIG. 16 is a cross-sectional view along an A-A direction of FIG. 15.

(5) Depositing a transparent conductive film on the substrate on which the pattern described above is formed, and patterning the transparent conductive film by a patterning process to form a pattern of a transparent conductive layer, wherein the pattern of the transparent conductive layer includes an anode 21 located in the display area 100 and an auxiliary power supply line 330 located in the edge area 300, as shown in FIG. 15 and FIG. 16. FIG. 15 is a schematic diagram after the transparent conductive layer is formed, and FIG. 16 is a cross-sectional diagram along an A-A direction of FIG. 15.

In an exemplary embodiment, the anode 21 is formed on a second planarization layer 16 in the display area 100, and the anode 21 is connected with the connection electrode 17 through a third via.

In an exemplary embodiment, the auxiliary power supply line 330 is electrically connected to a second power supply portion 310B, wherein a part of the auxiliary power supply line 330 is lapped on the second power supply portion 310B, and the other part of the auxiliary power supply line 330 is connected to the second power supply portion 310B through a fourth via V4.

In an exemplary embodiment, an orthographic projection of the auxiliary power supply line 330 on the substrate at least partially overlaps with an orthographic projection of the third dam foundation 422 on the substrate, and a distance between an end of the auxiliary power supply line 330 away from the display area 100 and the display area 100 is less than a distance between an end of the third dam foundation 422 away from the display area 100 and the display area 100. That is, the auxiliary power supply line 330 partially covers the third dam foundation 422.

In an exemplary embodiment, the third dam foundation 422 includes a third surface, a third proximal side and a third distal side. The auxiliary power supply line 330 partially covering the third dam foundation 422 may mean that the auxiliary power supply line 330 partially covers the third surface of the third dam foundation 422 and completely covers a second proximal side of the third dam foundation.

In an exemplary embodiment, an orthographic projection of the auxiliary power supply line 330 on the base covers an orthographic projection of the second dam foundation 411 on the substrate. That is, the auxiliary power supply line 330 covers the second dam foundation 411.

In an exemplary embodiment, the second dam foundation 411 includes a second surface, a second proximal side and a second distal side. The auxiliary power supply line 330 covering the second dam foundation 411 may mean that the auxiliary power supply line 330 completely covers the second surface, the second proximal side and the second distal side of the second dam foundation 411. That is, the auxiliary power supply line 330 wraps the second surface, the second proximal side and the second distal side of the second dam foundation 411.

In an exemplary embodiment, an orthographic projection of the auxiliary power supply line 330 on the substrate at least partially overlaps with an orthographic projection of the second power supply portions 310B exposed on both sides of the second dam foundation 411 on the substrate. That is, the auxiliary power supply line 330 covers and is electrically connected with the second power supply portions 310B exposed on both sides of the second dam foundation 411. Because the auxiliary power supply line 330 is connected to the second power supply portion 310B, a connection between the auxiliary power supply line 330 and the power supply line 310 is achieved.

In an exemplary embodiment, an orthographic projection of the auxiliary power supply line 330 on the substrate at least partially overlaps with an orthographic projection of the first driving circuit 201, the second driving circuit 202, and the third driving circuit 203 on the substrate.

In an exemplary embodiment, the auxiliary power supply line 330 is provided with a fifth Via V5 exposing the second planarization layer 16, wherein the fifth via V5 is located in a first circuit region 301A, a second circuit region 301B, and a third circuit region 301C.

In an exemplary embodiment, an orthographic projection of the fifth via V5 on the substrate located in a third circuit region 301C at least partially overlaps with an orthographic projection of the second via V2 on the substrate.

In an exemplary embodiment, the fifth via V5 is arranged to release the gas in the second planarization layer 16 to form a deflation channel, and discharge a gas generated by a planarizing film layer during a process, so as to avoid peeling of a film layer and improve the process quality.

In an exemplary embodiment, there are a plurality of fifth vias V5, and the plurality of fifth vias V5 are arranged in a matrix to uniformly release the gas in the second planarization layer 16.

In an exemplary embodiment, in a plane parallel to the display substrate, a shape of the fifth via V5 may be a triangle, a rectangle, a polygon, a circle, an ellipse, or the like.

In an exemplary embodiment, a shape of the fifth via V5 may be a rectangular, a length of the rectangle may be about 10 μm to 40 μm, a width of the rectangle may be about 10 μm to 40 μm, and a distance between adjacent fifth vias V5 may be about 10 μm to 40 μm.

Figure 17:
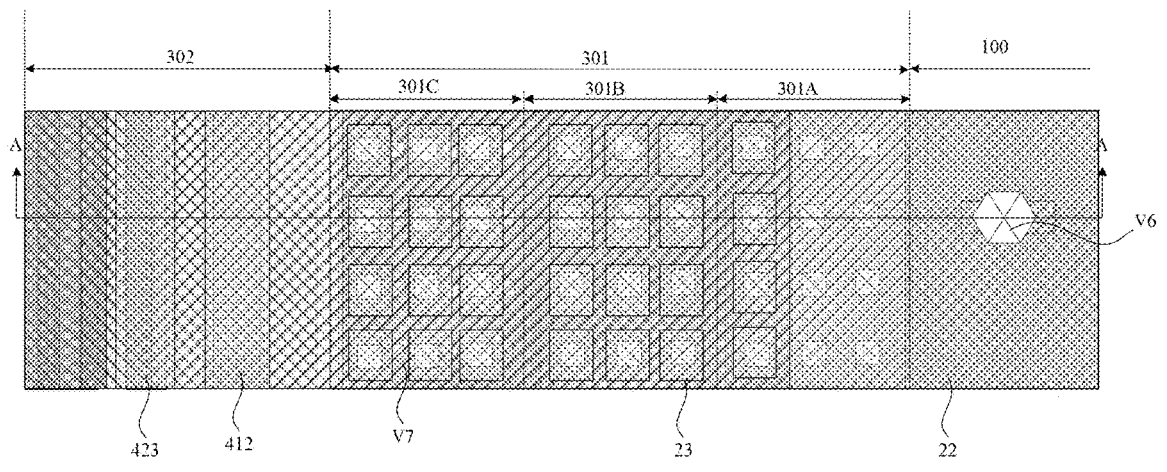
FIG. 17 is a schematic diagram after a third organic layer is formed.
Figure 18:
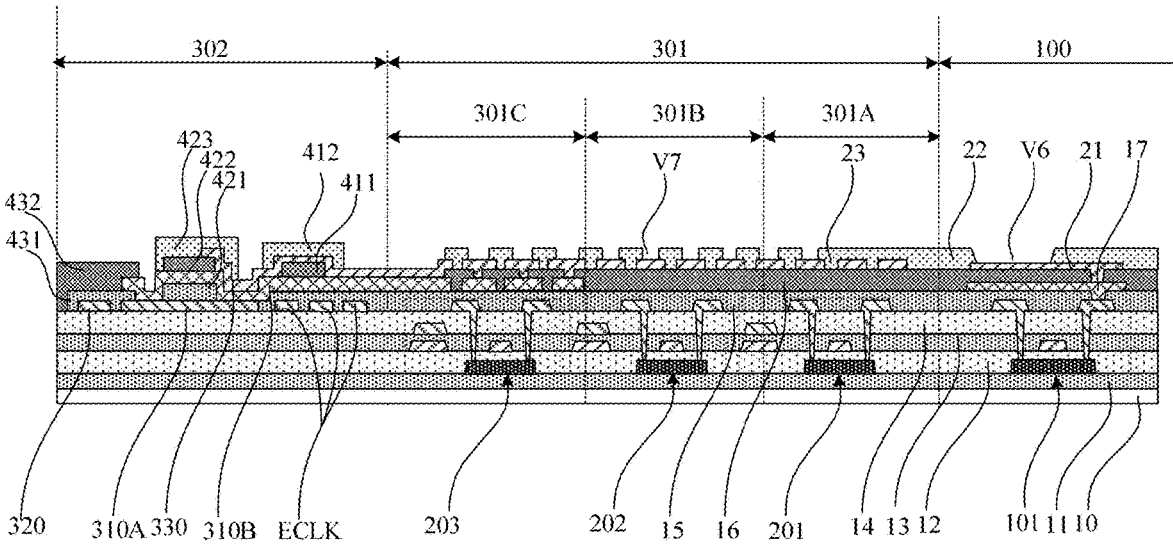
FIG. 18 is a schematic diagram along an A-A direction in FIG. 17.

(6) Coating a third organic film on the substrate on which the pattern described above is formed, and patterning the third organic film by a patterning process to form a pattern of a third organic layer, wherein the pattern of the third organic layer includes a pixel definition layer 22 located in the display area 100, an isolation layer 23 located in the circuit region 301, and a fourth dam foundation 412 and a fifth dam foundation 423 located in the isolation dam region 302. FIG. 17 is a schematic diagram after the third organic layer is formed, and FIG. 18 is a schematic diagram along an A-A direction of FIG. 17.

In an exemplary embodiment, the pixel definition layer 22 is provided with a sixth via V6 exposing an anode 21.

In an exemplary embodiment, in a plane parallel to the display substrate, a shape of the sixth via may be a triangle, a rectangle, a polygon, a circle, an ellipse, or the like.

In an exemplary embodiment, a shape of the six via may be a rectangular, a length of the rectangle may be about 10 μm to 40 μm, a width of the rectangle may be about 10 μm to 40 μm, and a distance between adjacent six vias may be about 10 μm to 40 μm.

In an exemplary embodiment, a distance between an end of the isolation layer 23 close to the display area 100 and the display area 100 is equal to a distance between an end of the pixel definition layer 22 away from the display area 100 and the display area 100, and a distance between an end of the isolation layer 23 away from the display area 100 and the display area 100 is less than or equal to a distance between an end of the second planarization layer 16 away from the display area 100 and the display area 100.

In an exemplary embodiment, a distance between an end of the isolation layer 23 away from the display area and the display area is less than or equal to a distance between an end of the second planarization layer away from the display area and the display area.

In an exemplary embodiment, an orthographic projection of the isolation layer 23 on the substrate covers an orthographic projection of the fifth via on the substrate.

In an exemplary embodiment, the isolation layer 23 is provided with a plurality of seventh via V7 exposing an auxiliary power supply line 330. The plurality of seventh vias V7 may be arranged in an array or the plurality of seventh vias may be interconnected. FIG. 17 and FIG. 18 illustrate examples that the plurality of seventh vias may be interconnected.

In an exemplary embodiment, the plurality of seventh vias V7 are located in a first circuit region 301A, a second circuit region 301B, and a third circuit region 301C.

In an exemplary embodiment, an orthographic projection of the seventh via V7 located in a third circuit region 301C on the substrate at least partially overlaps with an orthographic projection of the fourth via V4 on the substrate.

In an exemplary embodiment, the fourth dam foundation 412 is arranged on an auxiliary power supply line 330 covering the second dam foundation 411, and an orthographic projection of the fourth dam foundation 412 on the substrate covers an orthographic projection of the second dam foundation 411 on the substrate.

In an exemplary embodiment, a length of the fourth dam foundation 412 along a first direction may be from about 20 mum to 60 mum.

In an exemplary embodiment, in a plane perpendicular to the display substrate, a cross-sectional shape of the fourth dam foundation 412 may be a trapezoid or a rectangle. When the cross-sectional shape of the fourth dam foundation 412 is a trapezoid, a length of the surface of the fourth dam foundation 412 on a side away from the substrate is smaller than a length of the surface of the fourth dam foundation 412 on a side close to the substrate, and the length of the surface on the side away from the substrate may be about 20 μm to 40 μm.

In an exemplary embodiment, the fifth dam foundation 423 is arranged on a third dam foundation 422, and an orthographic projection of the fifth dam foundation 423 on the substrate overlaps with an orthographic projection of the third dam foundation 422 on the substrate.

In an exemplary embodiment, the fifth dam foundation 423 may be about 20 μm to 60 μm along a first direction.

In an exemplary embodiment, in a plane perpendicular to the display substrate, a cross-sectional shape of the fifth dam foundation 423 may be a trapezoid or a rectangle. When the cross-sectional shape of the fifth dam foundation 423 is a trapezoid, a length of the surface on a side away from the substrate is smaller than a length of the surface on a side close to the substrate, and the length of the surface on the side away from the substrate may be about 20 μm to 40 μm.

In an exemplary embodiment, an auxiliary power supply line 330 is exposed between the fourth dam foundation 412 and the fifth dam foundation 423, and the auxiliary power supply line 330 is exposed on a side of the fourth dam foundation 412 adjacent to the display area 100.

Figure 19:
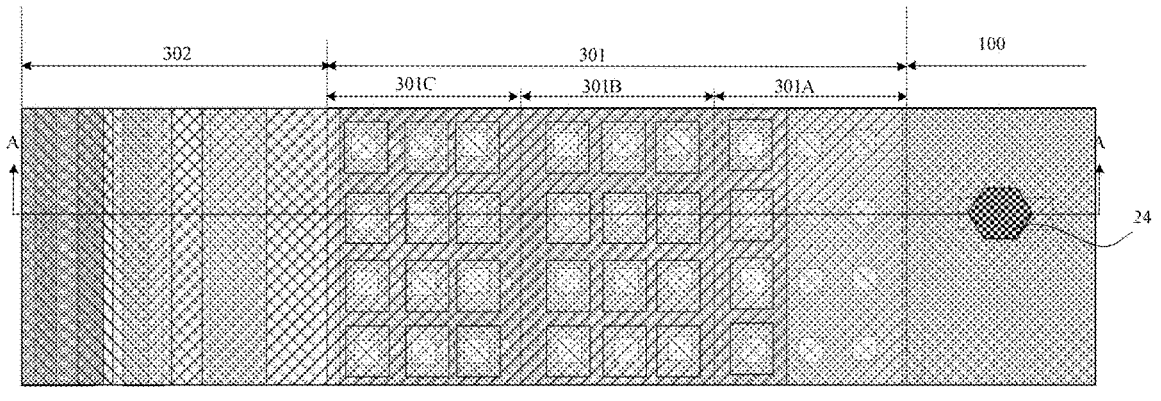
FIG. 19 is a schematic diagram after an organic light emitting layer is formed.
Figure 20:
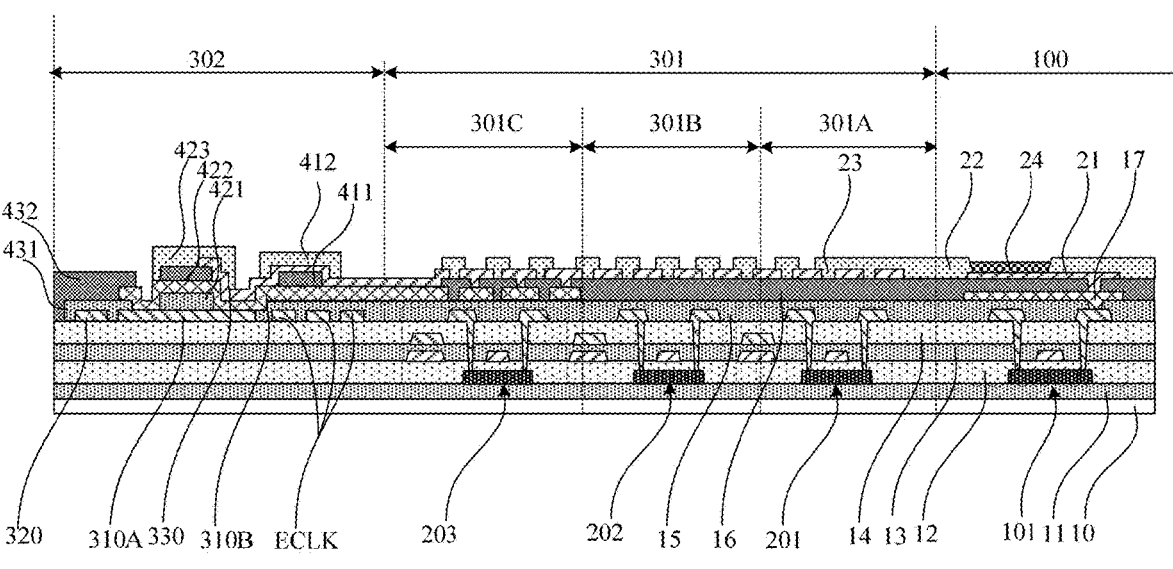
FIG. 20 is a cross-sectional view along an A-A direction of FIG. 19.

(7) Forming an organic light-emitting layer 24 on the substrate on which the pattern described above is formed, as shown in FIG. 19 and FIG. 20. FIG. 19 is a schematic diagram after the organic light-emitting layer is formed, and FIG. 20 is a cross-sectional view along the A-A direction of FIG. 19.

In an exemplary embodiment, the organic light emitting layer 24 is formed in a six via V6 of the pixel definition layer 22 in the display area 100 to achieve a connection between the organic light emitting layer 24 and the anode 21. Because the anode 21 is connected to the connection electrode 17, and the connection electrode 17 is connected to the first drain electrode, a connection between the organic light-emitting layer 24 and the first drain electrode is thereby achieved.

In an exemplary embodiment, the organic emitting layer 24 may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary implementation mode, hole injection layers of all sub-pixels may be a common layer connected together, electron injection layers of all the sub-pixels may be a common layer connected together, hole transport layers of all the sub-pixels may be a common layer connected together, electron transport layers of all the sub-pixels may be a common layer connected together, hole block layers of all the sub-pixels may be a common layer connected together, emitting layers of adjacent sub-pixels may be overlapped slightly or may be isolated from each other, and electron block layers of adjacent sub-pixels may be overlapped slightly or may be isolated from each other.

Figure 21:
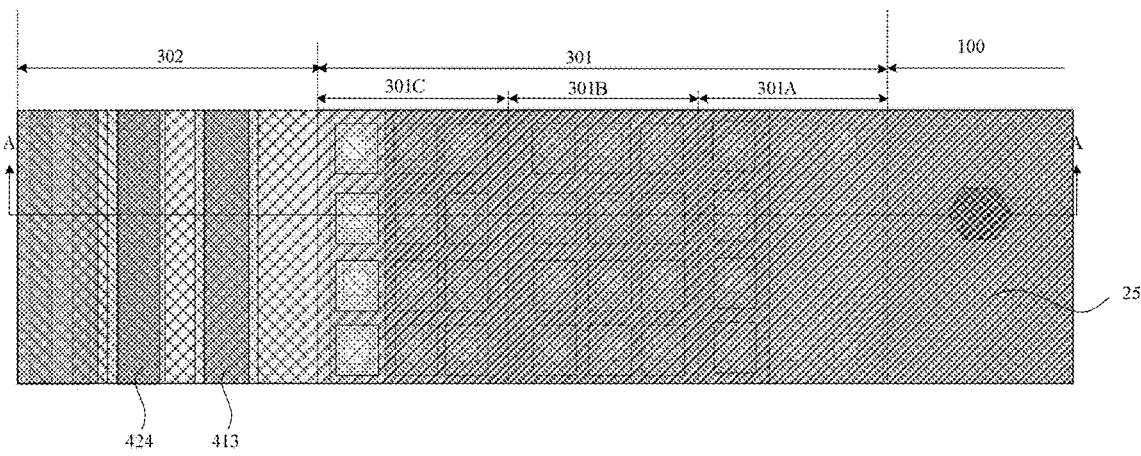
FIG. 21 is a schematic diagram after a cathode is formed.
Figure 22:
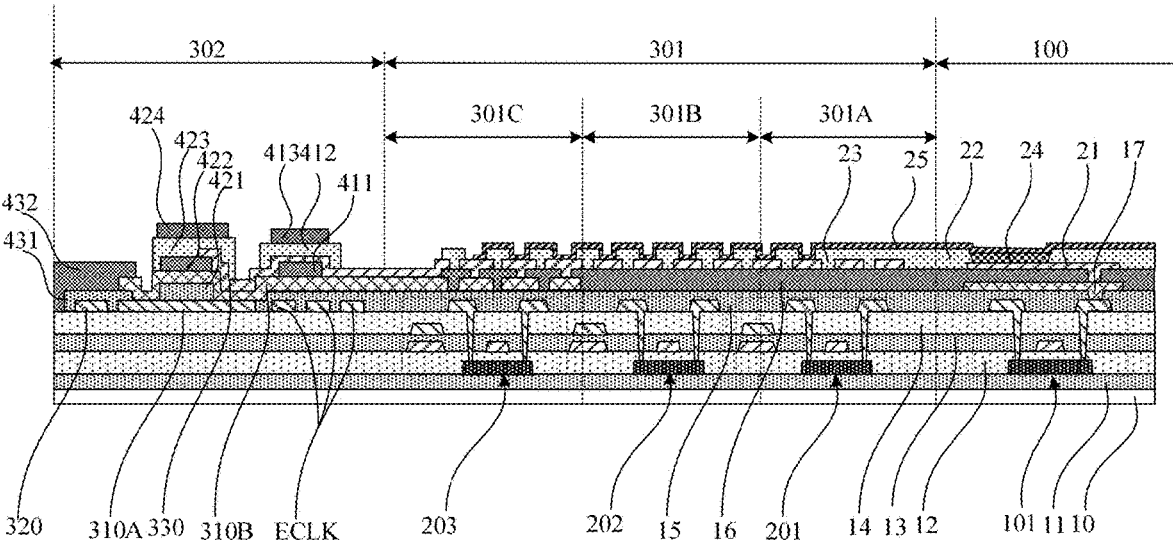
FIG. 22 is a cross-sectional view along an A-A direction of FIG. 21.

(8) Forming a cathode 25 located in the display area 100 and the circuit region 301, and a sixth dam foundation 413 and a seventh dam foundation 424 located in the isolation dam region 302 on the substrate on which the pattern described above is formed, as shown in FIG. 21 and FIG. 22. FIG. 21 is a schematic diagram after the cathode is formed, and FIG. 22 is a cross-sectional diagram in an A-A direction of FIG. 21.

In an exemplary embodiment, a distance between an end of the cathode 25 away from the display area 100 and the display area 100 is less than a distance between a side of the isolation layer 23 away from the display area 100 and the display area 100.

In an exemplary embodiment, a part of the cathode 25 is formed on an organic light emitting layer 24 in the display area 100, the cathode 25 is connected to the organic light emitting layer 24, and the other part of the cathode 25 is connected to the auxiliary power supply line 330 through a seventh via.

In an exemplary embodiment, because the cathode 25 is connected to an auxiliary power supply line 330 and the auxiliary power supply line 330 is electrically connected to a second power supply portion 310B of the power supply line 310, a connection between the cathode 25 and the power supply line 310 is thereby achieved.

In an exemplary embodiment, the cathode may be made of any one or more of magnesium (Mg), silver (Ag), aluminum (Al), copper (Cu), and lithium (Li), or an alloy made of any one or more of the above metals.

In an exemplary embodiment, the sixth dam foundation 413 is arranged on the fourth dam foundation 412, and an orthographic projection of the fourth dam foundation on the substrate overlaps with an orthographic projection of the sixth dam foundation 413 on the substrate.

In an exemplary embodiment, the sixth dam foundation 413 may be about 20 μm to 60 μm along a first direction.

In an exemplary embodiment, in a plane perpendicular to the display substrate, a cross-sectional shape of the sixth dam foundation 413 may be a trapezoid or a rectangle. When the cross-sectional shape of the sixth dam foundation 413 is a trapezoid, a length of the surface of the sixth dam foundation 413 on a side away from the substrate is smaller than a length of the surface of the sixth dam foundation 413 on a side close to the substrate, and the length of the surface of the sixth dam foundation 413 on the side away from the substrate may be about 20 μm to 40 μm.

In an exemplary embodiment, the second dam foundation 402, the auxiliary power supply line 330 covering the second dam foundation, the fourth dam foundation 411, and the sixth dam foundation 413 form a first isolation dam 410.

In an exemplary embodiment, the seventh dam foundation 424 is arranged on the fifth dam foundation 423, and an orthographic projection of the fifth dam foundation 423 on the substrate covers an orthographic projection of the seventh dam foundation 424 on the substrate.

In an exemplary embodiment, the seventh dam foundation 424 may be about 20 μm to 60 μm along a first direction.

In an exemplary embodiment, in a plane perpendicular to the display substrate, a cross-sectional shape of the seventh dam foundation 424 may be a trapezoid or a rectangle. When the cross-sectional shape of the seventh dam foundation 424 is a trapezoid, a length of the surface of the seventh dam foundation 424 on a side away from the substrate is smaller than a length of the surface of the seventh dam foundation 424 on a side close to the substrate, and the length of the surface on the side away from the substrate may be about 20 μm to 40 μm.

In an exemplary embodiment, the first dam foundation 421, the second power source portion 310B covering the first dam foundation, the third dam foundation 422, the fifth dam foundation 423, and the seventh dam foundation 424 form a second isolation dam 420.

In an exemplary embodiment, a distance between the first isolation dam 410 and the display area 100 is smaller than that between the second isolation dam 420 and the display area 100.

In an exemplary embodiment, a length of an orthographic projection of the first isolation dam 410 and the second isolation dam 420 on the substrate 10 may be about 20 μm to about 60 μm, and a distance between the first isolation dam 410 and the second isolation dam 420 may be about 20 μm to about 60 μm.

In an exemplary embodiment, in a plane perpendicular to the display substrate, cross-sectional shapes of the first isolation dam 410 and the second isolation dam 420 may be trapezoids.

In an exemplary embodiment, the sixth dam foundation 413 and the seventh dam foundation 424 are of an integrally formed structures. Cathode 25 may be formed before or after the formation of a sixth dam foundation 413 and a seventh dam foundation 424.

In an exemplary embodiment, an orthographic projection of the first isolation dam 410 on the substrate at least partially overlaps with an orthographic projection of a clock signal line of the third driving circuit on the substrate.

(9) Forming an encapsulation layer 26 on a basis of forming the patterns described above, wherein the encapsulation layer 26 is formed in the display area 100, the circuit region 301, and the isolation dam region 302, as shown in FIG. 5.

In an exemplary embodiment, the encapsulation layer 26 of the display area 100 and the circuit region 301 has a stacked structure of a first encapsulation layer 261, a second encapsulation layer 262 and a third encapsulation layer 263, and the encapsulation layer 26 of the isolation dam region 302 has a stacked structure of a first encapsulation layer 261, and a third encapsulation layer 263.

In an exemplary embodiment, the first encapsulation layer may be made of an inorganic material, covering a cathode 25 in the display area 100, covering a post spacer layer 23 in the circuit region 301, and wrapping a first isolation dam 410 and a second isolation dam 420 in the isolation dam region 302. The second encapsulation layer may be made of an organic material, and is arranged in the display area 100 and the circuit region 301. The third encapsulation layer may be made of an inorganic material, covering the second encapsulation layer of the display area 100 and the circuit region 301, and covering the first encapsulation layer in the isolation dam region 302. That is, the encapsulation layer 26 of the display area 100 and the circuit region 301 has a laminated structure of an inorganic material/an organic material/an inorganic material, an organic material layer is arranged between two inorganic material layers, and the encapsulation layer 26 of the isolation dam region 302 has a laminated structure of inorganic material/inorganic material.

In an exemplary embodiment, the first insulation layer, the second insulation layer, the third insulation layer and the fourth insulation layer may be made of any one or more of silicon oxide (SiOx), silicon nitride (SiNx) and silicon oxynitride (SiON), and may be a single-layer, a multi-layer or a composite layer. The first insulation layer is called a buffer layer, which is used to improve the water and oxygen resistance of the substrate. The second insulation layer and the third insulation layer are called gate insulating (GI) layers. The fourth insulation layer is called an interlayer insulating (ILD) layer.

In an exemplary embodiment, the first metal thin film, the second metal thin film, the third metal thin film, and the fourth metal thin film may be made of metal materials, such as any one or more of silver (Ag), copper (Cu), aluminum (Al), titanium (Ti), and molybdenum (Mo), or alloy materials of the above metals, such as AlNd alloy or MoNb alloy, and may be a single-layer structure or a multi-layer composite structure, such as Ti/Al/Ti. The transparent conductive thin film may include Indium Tin Oxide (ITO) or Indium Zinc Oxide (IZO). The pixel definition layer may be made of polyimide, acrylic, polyethylene terephthalate, or the like. An active layer thin film may be made of an amorphous Indium Gallium Zinc Oxide (a-IGZO), Zinc OxyNitride (ZnON), Indium Zinc Tin Oxide (IZTO), amorphous Silicon (a-Si), polycrystalline Silicon (p-Si), hexathiophene, polythiophene, and other materials, that is, the present disclosure is applicable to transistors manufactured based on an oxide technology, a silicon technology, and an organic matter technology.

According to the exemplary embodiment of the present disclosure, a first power supply portion 310A of the power supply line 310 is formed by a first source-drain metal layer, and a second power supply portion 310B of the power supply line 310 is formed by a second source-drain metal layer, so that a double-layer power supply line 310 is formed in an edge area 300, achieving a double-layer power supply wiring in a parallel structure, reducing a resistance of power supply wiring in the edge area 300, minimizing voltage drop of voltage signals to the maximum extent, and improving display brightness uniformity in the display area 100 and display quality.

In an exemplary embodiment, a distance between the first power supply portion 310A and the third driving circuit 203 is greater than or equal to 1 micron and less than or equal to 6 microns, and as an example, the distance between the first power supply portion 310A and the third driving circuit 203 may be 4 microns, which is not limited in this disclosure.

In an exemplary embodiment, a distance between the first power supply portion 310A and the crack detection line 320 is greater than or equal to 1 micron and less than or equal to 6 microns, and as an example, the distance between the first power supply portion 310A and the crack detection line 320 may be 4 microns, which is not limited in this disclosure.

In the present disclosure, a distance between the first power supply portion 310A and the third driving circuit 203 and a distance between the first power supply portion 310A and the crack detection line 320 are arranged such that a width of the first power supply portion 310A is sufficiently large in a situation that the requirements of the display substrate exposure, etching and other processes and signal interference can be satisfied, thereby reducing the voltage drop of the power supply line, being able to improve the display uniformity of the display substrate, and reducing the power consumption of the display substrate.

In the present disclosure, a distance between the first power supply portion 310A and the third driving circuit 203 may be equal to or may not be equal to a distance between the first power supply portion 310A and the crack detection line 320, which is not limited in this disclosure.

In the present disclosure, an orthographic projection of the second power supply portion 310B on the substrate 10 covers an orthographic projection of the first power supply portion 310A and the third driving circuit 203 on the substrate 10. In the present disclosure, the second power supply portion 310B is arranged in such a manner that a length of the second power supply portion 310B along a first direction is sufficiently large, thereby reducing the voltage drop of the power supply line, being able to improve the display uniformity of the display substrate, and reducing the power consumption of the display substrate.

In the present disclosure, a distance between the end of the second power supply portion 310B close to the display area 100 and the display area 100 is greater than a distance between a clock signal line CLK in the second driving circuit 202 and the display area 100, thereby reducing a load of the clock signal line CLK in the second driving circuit 202 and ensuring a normal display of a display unit in the display area 100.

In the present disclosure, the first protective layer 431 wraps an end of the first power supply portion 310A away from the display area 100, and the second protective layer 432 wraps an end of the second power supply portion 310B away from the display area 100, thereby preventing corrosion and dark spots.

In the present disclosure, the second planarization layer 16 covers a second power supply portion located at the edge of the second via, thereby preventing corrosion and dark spots.

In the present disclosure, due to manners of arrangements of the second power supply portion 310B and the second planarization layer, a distance between an end of the first isolation dam 410 close to the display area 100 and an end of the second power supply portion 310B close to the display area may be large, and the packaging reliability of the display substrate can be improved.

In the present disclosure, the auxiliary power supply line 330 covers the first driving circuit 201, the second driving circuit 202, and the third driving circuit 203, so that the voltage drop of the power supply line can be reduced, and the interference of external environment or signals on the first driving circuit 201, the second driving circuit 202, and the third driving circuit 203 can also be shielded.

According to the exemplary embodiment of the present disclosure, a second via and a fifth via are respectively arranged on the second power supply portion 310B and the auxiliary power supply line 330 to form a deflation channel, so that gases generated by a plat layer may be effectively discharged in the process, thereby avoiding peeling of a film layer and improving process quality. The preparation process of the display substrate in the exemplary embodiment of the present disclosure has good process compatibility, simple process achievement, easy implementation, a high production efficiency, a low production cost, and a high yield.

The description of the structure and preparation process of the display substrate according to the present disclosure is merely illustrative. In an exemplary embodiment, a corresponding structure may be changed and a patterning process may be increased or decreased according to actual needs, which is not limited in the present disclosure.

The embodiment of the disclosure further provides a preparation method of the display substrate, which is arranged to prepare a display substrate, wherein the display substrate comprises a display area and an edge area and the preparation method for the display substrate provided by the embodiment of the disclosure may include the following steps:

In step S1, providing a substrate.

In step S2, sequentially forming a first power supply portion and a second power supply portion on the substrate to form a power supply line located in an edge area.

In an exemplary embodiment, an orthographic projection of the second power supply portion on the substrate is at least partially overlapped with an orthographic projection of the first power supply portion on the substrate, and a distance between an end of the second power supply portion far away from the display area and the display area is greater than or equal to a distance between an end of the first power supply portion far away from the display area and the display area.

The display substrate is the display substrate according to any of the aforementioned embodiments, and has similar implementation principles and implementation effects, which will not be repeated here.

In an exemplary embodiment, the step S2 may include the following steps:

forming a pixel driving circuit in a display area on the substrate, a first driving circuit and a second driving circuit located in the circuit region, a third driving circuit located in the third circuit region, and a first power supply portion and a crack detection line located in the isolation dam region; forming a first planarization layer located in the display area and the circuit region and a first dam foundation and a first protective layer located in the isolation dam region on the substrate on which the first power supply portion is formed; forming a connection electrode located in a display area and a second power supply portion located in a circuit region and an isolation dam region on the substrate on which the first planarization layer is formed; forming a second planarization layer located in the display area and the circuit region, a second dam foundation, a third dam foundation and a second protective layer located in the isolation dam region on the substrate on which the second power supply portion is formed; forming an anode located in a display area and an auxiliary power supply line located in an edge area on the substrate on which the second planarization layer is formed; forming a pixel definition layer located in a display area, an isolation layer located in a circuit region, and a fourth dam foundation and a fifth dam foundation located in an isolation dam region on the substrate on which the auxiliary power supply line is formed; and forming an organic light emitting layer located in the display area, a cathode located in the display area and the circuit region, and a sixth dam foundation and a seventh dam foundation located in the isolation dam region on the substrate on which the pixel definition layer is formed.

An embodiment of the present disclosure further provides a display apparatus, including a display substrate.

The display substrate is the display substrate according to any of the aforementioned embodiments, and has similar implementation principles and implementation effects, which will not be repeated here.

In an exemplary embodiment, the display apparatus may be any product or component with a display function, such as a mobile phone, a tablet computer, a television, a display, a notebook computer, a digital photo frame, or a navigator.

Although the embodiments disclosed in the present disclosure are as above, the described contents are only embodiments used for convenience of understanding the present disclosure and are not intended to limit the present disclosure. Any skilled in the art to which the present disclosure pertains, without departing from the spirit and scope disclosed in the present disclosure, may make any modifications and changes in a form and details of implementation. However, the scope of patent protection of the present application should still be subject to the scope defined by the appended claims.

The invention claimed is:

1. A display substrate, comprising a display area and an edge area located on a side of the display area, the display substrate comprising a substrate and a power supply line arranged on the substrate and located in the edge area, wherein:

the power supply line comprises a first power supply portion and a second power supply portion connected with each other, and the second power supply portion is located on a side of the first power supply portion away from the substrate;

the display area comprises a plurality of display units, wherein at least one display unit of the plurality of display units comprises a pixel driving circuit and a light emitting device, wherein the pixel driving circuit is electrically connected with an anode of the light emitting device, and the power supply line is electrically connected with a cathode of the light emitting device;

an orthographic projection of the second power supply portion on the substrate is at least partially overlapped with an orthographic projection of the first power supply portion on the substrate, and a distance between an end of the second power supply portion away from the display area and the display area is greater than or equal to a distance between an end of the first power supply portion away from the display area and the display area;

the edge area comprises a circuit region and an isolation dam region sequentially arranged in a direction away from the display area, the circuit region comprising a first circuit region, a second circuit region and a third circuit region sequentially arranged in a direction away from the display area;

the pixel driving circuit comprises a writing transistor, a compensation transistor, a light emitting transistor, a first scan signal line, a second scan signal line and a light emitting signal line; the first scan signal line is electrically connected to a control electrode of the writing transistor, the second scan signal line is electrically connected to a control electrode of the compensation transistor, and the light emitting signal line is electrically connected to a control electrode of the light emitting transistor; and the writing transistor and the compensation transistor have different transistor types;

the display substrate further comprises a first driving circuit located in the first circuit region, a second driving circuit located in the second circuit region, and a third driving circuit located in the third circuit region and the isolation dam region;

the first driving circuit is electrically connected with the first scan signal line, the second driving circuit is electrically connected with the second scan signal line, and the third driving circuit is electrically connected with the light emitting signal line;

the first power supply portion is located in the isolation dam region, and the second power supply portion is located in the isolation dam region and the circuit region; and an orthographic projection of the second power supply portion on the substrate is at least partially overlapped with an orthographic projection of the third driving circuit on the substrate, and there is no overlapping area between the orthographic projection of the second power supply portion on the substrate and an orthographic projection of the second driving circuit on the substrate.

2. The display substrate according to claim 1, further comprising a crack detection line located in the isolation dam region, wherein the crack detection line is arranged in a same layer as the first power supply portion and is located on a side of the first power supply portion away from the display area; and a distance between the first power supply portion and the crack detection line is greater than or equal to 1 micron and less than or equal to 6 microns.

3. The display substrate of claim 2, further comprising a first planarization layer located in the display area, the circuit region and the isolation dam region, and a first protective layer located in the isolation dam region, wherein the first planarization layer is located between the first power supply portion and the second power supply portion and is arranged in a same layer as the first protective layer; and an orthographic projection of the first protective layer on the substrate covers an orthographic projection of the crack detection line on the substrate and is at least partially overlapped with the orthographic projection of the first power supply portion on the substrate.

4. The display substrate according to claim 3, wherein the third driving circuit comprises a clock signal line located in the isolation dam region; the clock signal line is arranged in a same layer as the first power supply portion and is located on a side of the first power supply portion close to the display area; and an orthographic projection of the first planarization layer on the substrate covers an orthographic projection of the clock signal line on the substrate, and there is no overlapping area between the orthographic projection of the first planarization layer on the substrate and the orthographic projection of the first power supply portion on the substrate.

5. The display substrate according to claim 3, wherein the second power supply portion is provided with a plurality of second via holes exposing the first planarization layer, the plurality of second vias being arranged in a matrix; and an orthographic projection of the plurality of second via holes on the substrate is at least partially overlapped with the orthographic projection of the third driving circuit on the substrate.

6. The display substrate of claim 5, further comprising a second planarization layer located in the display area and the circuit region and a second protective layer located in the isolation dam region, wherein:

the second planarization layer is located on a side of the second power supply portion away from the substrate and is arranged in a same layer as the second protective layer; and an orthographic projection of the second protective layer on the substrate covers the orthographic projection of the first protective layer on the substrate, and an orthographic projection of the second planarization layer on the substrate covers the orthographic projection of the second via holes on the substrate.

7. The display substrate according to claim 6, further comprising an auxiliary power supply line located in the edge area, wherein:

the anode is located on a side of the second planarization layer away from the substrate, and is arranged in a same layer as the auxiliary power supply line;

the auxiliary power supply line is electrically connected with the second power supply portion; and an orthographic projection of the auxiliary power supply line on the substrate is at least partially overlapped with orthographic projections of the first driving circuit, the second driving circuit, and the third driving circuit on the substrate.

8. The display substrate according to claim 7, wherein the auxiliary power supply line is provided with a plurality of fifth via holes exposing the second planarization layer, the plurality of fifth via holes being arranged in a matrix;

the plurality of fifth via holes are located in the first circuit region, the second circuit region and the third circuit region; and an orthographic projection of the fifth via holes located in the third circuit region on the substrate is at least partially overlapped with an orthographic projection of the second via holes on the substrate.

9. The display substrate according to claim 8, further comprising a pixel definition layer located in the display area and an isolation layer located in the circuit region, wherein:

the pixel definition layer is located on a side of the anode away from the substrate, and is arranged in a same layer as the isolation layer; and a distance between an end of the isolation layer away from the display area and the display area is less than or equal to a distance between an end of the second planarization layer away from the display area and the display area, and an orthographic projection of the isolation layer on the substrate covers the orthographic projection of the fifth via holes on the substrate.

10. The display substrate according to claim 9, further comprising an organic light emitting layer sequentially stacked on the substrate and located in the display area, and the cathode located in the display area and the circuit region, wherein the cathode is electrically connected with the auxiliary power supply line.

11. The display substrate of claim 10, wherein the isolation dam region further comprises a first isolation dam and a second isolation dam; and the second isolation dam is located on a side of the first isolation dam away from the display area, and is located on a side of the second protective layer close to the display area.

12. The display substrate of claim 11, further comprising a first dam foundation, a third dam foundation, a fifth dam foundation, and a seventh dam foundation located in the isolation dam region, wherein:

the first dam foundation is arranged in a same layer as the first planarization layer, the third dam foundation is arranged in a same layer as the second planarization layer, the fifth dam foundation is arranged in a same layer as the pixel definition layer, and the seventh dam foundation is located on a side of the pixel definition layer away from the substrate;

the second power supply portion covers the first dam foundation, the third dam foundation is arranged on the second power supply portion covering the first dam foundation and an orthographic projection of the third dam foundation on the substrate covers an orthographic projection of the first dam foundation on the substrate, the fifth dam foundation is arranged on the third dam foundation and an orthographic projection of the fifth dam foundation on the substrate covers the orthographic projection of the third dam foundation on the substrate, and the seventh dam foundation is arranged on the fifth dam foundation and the orthographic projection of the fifth dam foundation on the substrate covers an orthographic projection of the seventh dam foundation on the substrate;

the auxiliary power supply line partially covers the third dam foundation; and the first dam foundation, the second power supply portion covering the first dam foundation, the third dam foundation, the fifth dam foundation, and the seventh dam foundation form the second isolation dam.

13. The display substrate of claim 12, further comprising a second dam foundation, a fourth dam foundation, and a sixth dam foundation located in the isolation dam region, wherein:

the second dam foundation is arranged in a same layer as the second planarization layer, the fourth dam foundation is arranged in a same layer as the pixel definition layer, and the sixth dam foundation is arranged in a same layer as the seventh dam foundation;

the second dam foundation is arranged on the second power supply portion, the fourth dam foundation is arranged on the auxiliary power supply line covering the second dam foundation and an orthographic projection of the fourth dam foundation on the substrate covers an orthographic projection of the second dam foundation on the substrate, and the sixth dam foundation is arranged on the fourth dam foundation and the orthographic projection of the fourth dam foundation on the substrate covers an orthographic projection of the sixth dam foundation on the substrate; and the second dam foundation, the auxiliary power supply line covering the second dam foundation, the fourth dam foundation and the sixth dam foundation form the first isolation dam.

14. The display substrate according to claim 13, wherein an orthographic projection of the first isolation dam on the substrate is at least partially overlapped with a clock signal line on the substrate.

15. The display substrate according to claim 11, wherein an orthographic projection of the first isolation dam on the substrate is at least partially overlapped with a clock signal line on the substrate.

16. The display substrate according to claim 1, wherein a distance between the first power supply portion and the third driving circuit is greater than or equal to 1 micron and less than or equal to 6 microns.

17. A display apparatus, comprising the display substrate according to claim 1.

18. A method for preparing a display substrate, arranged to prepare the display substrate according to claim 1, the display substrate comprising the display area and the edge area located on the side of the display area, the method comprising:

providing the substrate; and sequentially forming the first power supply portion and the second power supply portion on the substrate to form the power supply line located in the edge area, wherein the orthographic projection of the second power supply portion on the substrate is at least partially overlapped with the orthographic projection of the first power supply portion on the substrate, and the distance between the end of the second power supply portion away from the display area and the display area is greater than or equal to the distance between the end of the first power supply portion away from the display area and the display area.

19. The method according to claim 18, wherein sequentially forming the first power supply portion and the second power supply portion on the substrate comprises:

forming a pixel driving circuit in the display area on the substrate, a first driving circuit and a second driving circuit located in the circuit region, a third driving circuit located in the third circuit region, and the first power supply portion and a crack detection line located in an isolation dam region;

forming a first planarization layer located in the display area and the circuit region, and a first dam foundation and a first protective layer located in the isolation dam region on the substrate on which the first power supply portion is formed;

forming a connection electrode located in the display area and the second power supply portion located in the circuit region and the isolation dam region on the substrate on which the first planarization layer is formed;

forming a second planarization layer located in the display area and the circuit region, a second dam foundation, a third dam foundation and a second protective layer located in the isolation dam region on the substrate on which the second power supply portion is formed;

forming the anode located in the display area and an auxiliary power supply line located in the edge area on the substrate on which the second planarization layer is formed;

forming a pixel definition layer located in the display area, an isolation layer located in the circuit region, and a fourth dam foundation and a fifth dam foundation located in the isolation dam region on the substrate on which the auxiliary power supply line is formed; and forming an organic light emitting layer located in the display area, the cathode located in the display area and the circuit region, and a sixth dam foundation and a seventh dam foundation located in the isolation dam region on the substrate on which the pixel definition layer is formed.

* * * * *